(12) United States Patent
Lindahl et al.

(10) Patent No.: US 9,172,394 B2
(45) Date of Patent: Oct. 27, 2015

(54) SIGNAL CONVERSION SYSTEM AND METHOD

(71) Applicant: Actiwave AB, Solna (SE)

(72) Inventors: Erik Lindahl, Stockholm (SE); Pär Gunnars Risberg, Solna (SE)

(73) Assignee: Actiwave AB, Solna (SE)

( * ) Notice: Subject to any disclaimer, the term of this patent is extended or adjusted under 35 U.S.C. 154(b) by 0 days.

(21) Appl. No.: 14/382,979

(22) PCT Filed: Mar. 6, 2013

(86) PCT No.: PCT/EP2013/054521
§ 371 (c)(1),
(2) Date: Sep. 4, 2014

(87) PCT Pub. No.: WO2013/131965
PCT Pub. Date: Sep. 12, 2013

(65) Prior Publication Data
US 2015/0015426 A1    Jan. 15, 2015

Related U.S. Application Data

(60) Provisional application No. 61/607,765, filed on Mar. 7, 2012.

(51) Int. Cl.
*H03M 5/08* (2006.01)
*H03K 9/08* (2006.01)
(Continued)

(52) U.S. Cl.
CPC . *H03M 5/08* (2013.01); *H03K 7/08* (2013.01); *H03K 9/08* (2013.01); *H03M 3/506* (2013.01); *H04L 25/4902* (2013.01)

(58) Field of Classification Search
CPC ............. H03K 7/08; H03K 9/08; H03K 9/00; H03M 3/506; H03M 5/08
USPC .................................... 341/155, 144, 152, 53
See application file for complete search history.

(56) References Cited

U.S. PATENT DOCUMENTS 6,150,963 A * 11/2000 Boscolo et al. ................. 341/53
7,576,604 B2 * 8/2009 Xu .................................. 330/10
(Continued)

FOREIGN PATENT DOCUMENTS

EP    1 050 971 A2    11/2000

OTHER PUBLICATIONS

International Preliminary Report on Patentability and Written Opinion issued in corresponding application No. PCT/EP2013/054521 issued on Sep. 9, 2014.

(Continued)

*Primary Examiner* — Brian Young
(74) *Attorney, Agent, or Firm* — Carter, DeLuca, Farrell & Schmidt, LLP

(57) ABSTRACT

A signal conversion system and method for converting an input signal to a pulse width modulated signal is disclosed. The signal conversion system includes a sample rate converter coupled with an associated pulse width modulation (PWM) module. A hardware and power efficient signal conversion system for resampling an audio input signal with an arbitrary sample rate to a pulse width modulated output audio signal for use in an audio processor and/or reproduction is disclosed. The signal conversion system may be particularly suitable for use in a battery operated consumer electronics device.

24 Claims, 7 Drawing Sheets

(51) Int. Cl.
*H03M 3/00* (2006.01)
*H04L 25/49* (2006.01)
*H03K 7/08* (2006.01)

(56) References Cited

U.S. PATENT DOCUMENTS

| | | | |
|---|---|---|---|
| 7,903,015 B1 * | 3/2011 | Hezar et al. | 341/152 |
| 7,965,138 B2 * | 6/2011 | Teplechuk | 330/10 |
| 8,315,302 B2 * | 11/2012 | Lewis | 375/238 |
| 2005/0046601 A1 | 3/2005 | Alrutz et al. | |

OTHER PUBLICATIONS

Sandler, "Digital-To-Analogue Conversion Using Pulse Width Modulation", Electronics and Communication Engineering Journal, Institution of Electrical Engineers, London, vol. 5, No. 6, Dec. 1, 1993, pp. 339-348.

International Search Report issued in coresponding application No. PCT/EP2013/054521 on Jul. 9, 2013.

\* cited by examiner

SIGNAL CONVERSION SYSTEM AND METHOD

CROSS-REFERENCE TO RELATED APPLICATION

The present application is a U.S. National Stage Application claiming the benefit of and priority to PCT International Application No. PCT/EP2013/054521 filed Mar. 6, 2013, which claims benefit of and priority to U.S. Provisional Application Ser. No. 61/607,765 filed on Mar. 7, 2012, entitled "Signal conversion systems and methods", by Erik Lindahl et al., the entire contents of each of which are incorporated by reference herein for all purposes.

BACKGROUND

1. Technical Field

The present disclosure is directed to a signal conversion system and associated methods for converting a digital input signal to a pulse width modulated output signal and, more particularly, to a signal conversion system with a pulse width modulator. The present disclosure is also directed to a pulse width modulator for use in an audio processing and/or reproduction system. The disclosure is further directed to a low cost, high quality audio encoding, playback and/or streaming process, system, and method.

2. Background

Mobile technologies and consumer electronic devices (CED) continue to expand in use and scope throughout the world. In parallel with continued proliferation, there has been rapid technical advance of device hardware and components, leading to increased computing power and incorporation of new peripherals onboard a device along with reductions in device size, power consumption, etc.

Such devices must routinely handle a range of signal types (e.g. audio signals, video signals, sensory data, etc.), often arising from a variety of sources. Such devices may also routinely generate signals to drive a range of transducer types (e.g. loudspeakers, tactile feedback displays, data communication channel, charge storage elements, display elements, etc.) and/or associated drivers. Many such transducers and/or drivers may be efficiently operated by pulse based driving schemes. In order to manage the interconnection of this wide range of signal types and driving schemes, it is common for such systems to implement sample rate converters and/or pulse width modulators to convert from a first signal to an alternative, pulse based signal. Sample rate conversion aspects may be used to lower computational signal processing requirements, synchronize signal sampling with a system clock, operate with a minimum sample rate, convert to a known sample rate, etc.

Furthermore, the input signals are typically provided from different sources having their own reference clock that differs in frequency, or operates asynchronously from available system clocks. Even though the variation in frequency may be small, due to stability requirements and performance demands in many applications, the data streams must still be sample rate converted in order to maintain synchronization and signal integrity over long sample streams. Use of an intermediate sample rate may also eliminate problems with switching synchronization of signal sources. For example, when a signal processing system is synchronized to an input sample stream (rather than with an independent or stabilized clock) and the sample stream clock changes, fluctuates, or is removed, "glitches" in generated resampled signals can occur.

In the conversion from a resampled signal to a pulse width modulated signal, intermodulation distortion (IMD), total harmonic distortion (THD), and modulation index (MI) based issues may serve to limit quality of the output signal.

Such issues as described above are of particular relevance to the areas of audio processing, video processing and telemetry applications.

SUMMARY

One objective of this disclosure is to provide an efficient and cost-effective signal conversion system and associated method for converting an input signal of arbitrary or fixed sample rate to a pulse width modulated output signal. Another objective is to provide a hardware-efficient pulse width modulation unit for resampling an audio input signal with an arbitrary or fixed sample rate to a pulse width modulated output audio signal for use in an audio processing system. Yet another objective is to provide an efficient high quality audio encoding, playback and/or streaming system and method.

The above objectives are wholly or partially met by devices, systems, and methods according to the appended claims in accordance with the present disclosure. Features and aspects are set forth in the appended claims, in the following description, and in the annexed drawings in accordance with the present disclosure.

According to a first aspect there is provided, a signal conversion system for converting an input signal to a pulse width modulated (PWM) output signal including a clock source for generating and/or means for accepting a clock signal; a carrier generator configured to generate a carrier signal with a carrier signal frequency; a cross-point section (CPS) block including a CPS comparator to compare the carrier signal to the input signal or a signal derived therefrom to produce a triggered signal based on the comparison and the input signal or the signal derived therefrom; a noise shaper configured to bit depth reduce the triggered signal to form a truncated signal; and a PWM comparator configured to compare the truncated signal and/or a signal generated therefrom with the carrier signal to produce the PWM output signal.

The signal conversion system may include a sample rate converter to resample the input signal to a resampled signal with a sample rate greater than the carrier signal frequency, the CPS comparator configured to accept the resampled signal.

The sample rate converter may include a counter configured to generate a count-disparity signal from the clock signal and the input signal; a first sigma delta unit configured to calculate a temporal correction value from the count disparity signal; a resampled clock generator configured to generate one or more resampled clock signals from the temporal correction value; and/or a second sigma delta unit configured to generate the resampled signal from one or more of the resampled clock signals and the input signal.

The noise shaper may be configured to shift the noise on the triggered signal, the input signal, and/or the resampled signal to a substantially inaudible frequency band to form the truncated signal. The noise shaper may include an $n^{th}$ order delta-sigma modulator configured to perform the bit depth reduction and/or noise shifting wherein n is a positive integer. The noise shaper may include a threshold of hearing model.

The carrier generator may include or be configured to accept a phase correction parameter, the carrier signal dependent upon the phase correction parameter. The phase correction parameter may be configured to set an initial value for the carrier signal.

The signal conversion system may include an analyzer configured to accept the input signal, the resampled signal or a signal generated therefrom and/or an external input and to calculate a PWM control signal, the carrier generator, the PWM comparator, and/or the noise shaper configured to accept the PWM control signal. The analyzer may be configured to calculate a power level from at least a portion of the resampled signal or a signal generated therefrom, the PWM control signal dependent upon the power level. The analyzer may be configured to accept an external input at least partially representative of a property selected from a group including temperature, humidity, sound level, loudspeaker feedback, voltage level, transducer current level, speaker enclosure temperature, speaker enclosure pressure level, and/or a combination thereof.

The signal conversion system may include a FIFO buffer coupled to the counter and the input signal, configured to store successive samples of the input signal and the count-disparity signal and/or an averaging block, coupled to the counter or the FIFO buffer and the first sigma delta loop, configured to calculate an averaged count-disparity signal from the count disparity signal, the first sigma delta loop configured to accept the averaged count-disparity signal.

The signal conversion system may include a low pass filter coupled to the resampled clock generator and the second sigma delta loop, the low pass filter configured to accept one or more resampled clock signals and the input signal or the de-jittered signal, and to calculate a filtered intermediate signal, the second sigma delta loop configured to accept the filtered intermediate signal. The low pass filter may be a low pass polyphase FIR filter.

Some non-limiting examples of waveforms for the carrier signal include a sawtooth, a zigzag, and a sinusoid.

The sample rate converter may be configured to resample the input to a sample rate in sync with the clock signal or a signal derived therefrom.

The CPS block may include a data ready function configured to update the triggered signal in sync with the carrier signal (e.g. such as when the carrier signal is at a maximum or a minimum value, etc.).

According to another aspect there is provided, a signal conversion system for converting an input signal to a pulse width modulated (PWM) signal including a clock source for generating and/or means for accepting a clock signal; a cross enable unit configured to generate one or more resampled clock signals and a de-jittered signal from the input signal and the clock signal; a linear interpolation unit configured to generate a resampled signal from the de-jittered signal, the clock signal, and one or more of the resampled clock signals; and a pulse width modulation (PWM) module including a carrier generator to generate a carrier signal, and a PWM comparator configured to compare the resampled signal or a signal derived therefrom and the carrier signal to form the PWM signal.

The signal conversion system may include a FIR filter module includig a low pass filter, the FIR filter module configured to generate a filtered intermediate signal from the de-jittered signal, the clock signal, and one or more of the resampled clock signals, the linear interpolation unit configured to accept the filtered intermediate signal. The low pass filter may be a low pass polyphase FIR filter.

The signal conversion system may include a counter configured to generate a count-disparity signal from the clock signal and the input signal; a first sigma delta unit configured to calculate a temporal correction value from the count-disparity signal; and/or a resampled clock generator configured to generate the one or more resampled clock signals from the temporal correction value.

According to yet another aspect there is provided, use of a signal conversion system in accordance the present disclosure in an audio signal processor.

According to another aspect there is provided, use of a signal conversion system in accordance with the present disclosure to process an audio stream, a data stream and/or a video stream.

According to yet another aspect there is provided, a method for generating a PWM signal from an input signal including generating a carrier signal with a carrier signal frequency; comparing the carrier signal with the input signal or a signal derived therefrom and saving the input signal or signal derived therefrom at an instant when they are equal to within a predetermined precision to form a triggered signal; truncating the triggered signal with a noise shaper to form a truncated signal; and comparing the truncated signal to the carrier signal to from the PWM signal.

The method may include resampling the input signal to a sample rate greater than the carrier signal frequency and/or updating the triggered signal in sync with the carrier signal (e.g. such as when the carrier signal is at a maximal and/or minimal value).

According to yet another aspect there is provided, a method for generating a pulse width modulated (PWM) signal from an input signal and a clock signal both with respective sample rates including calculating a count disparity signal from the input signal and the clock signal, the count disparity signal relating to the difference in sampling rate between the clock signal and the input signal; generating a temporal correction signal from the count-disparity signal, the temporal correction signal corresponding to a new sample rate, different from the input signal sample rate or the clock signal sample rate; interpolating the input signal at the new sample rate to form a resampled signal; forming a carrier signal with an initial value; and comparing the resampled signal or a signal generated therefrom with the carrier signal to form the PWM signal.

The method may include comparing the input signal, the resampled signal, or a signal generated therefrom with the carrier signal to form a triggered signal, truncating the triggered signal to form a truncated signal, and using the truncated signal in the comparison.

The method may include filtering the count disparity signal with a low pass filter before calculating the temporal correction signal; and/or setting and/or resetting the initial value of the carrier signal.

The step of generating a temporal correction signal may be at least partially accomplished by using a first sigma delta loop. The step of interpolating the input signal may be at least partially accomplished by using a second sigma delta loop. The truncation may be performed using a noise shaper.

The method may include shifting the noise of the resampled signal or a signal derived therefrom into a substantially inaudible frequency band; shaping the carrier signal and/or the resampled signal; and/or analyzing a property of the resampled signal to generate a PWM control signal, the comparison, shaping, or noise shaping, dependent upon the PWM control signal.

According to yet another aspect there is provided, a method for encoding an input signal including generating a carrier signal with a carrier signal frequency; comparing the carrier signal with the input signal or a signal derived therefrom and saving the input signal or signal derived therefrom at an instant when they are equal to within a predetermined precision to form a triggered signal; and truncating the triggered signal with a noise shaper to form the encoded signal.

The method may include updating the trigger signal in sync with the carrier signal (e.g. such as when the carrier signal is at a maximal and/or minimal value).

According to another aspect there is provided, a method for generating a PWM signal from an encoded signal produced by the encoding method in accordance with the present disclosure including generating a matching carrier signal with a frequency equal to the carrier signal frequency; and comparing the encoded signal with the carrier signal to from the PWM signal.

BRIEF DESCRIPTION OF THE DRAWINGS

Several aspects of the disclosure can be better understood with reference to the following drawings. In the drawings, like reference numerals designate corresponding parts throughout the several views.

DETAILED DESCRIPTION

Figure 1:
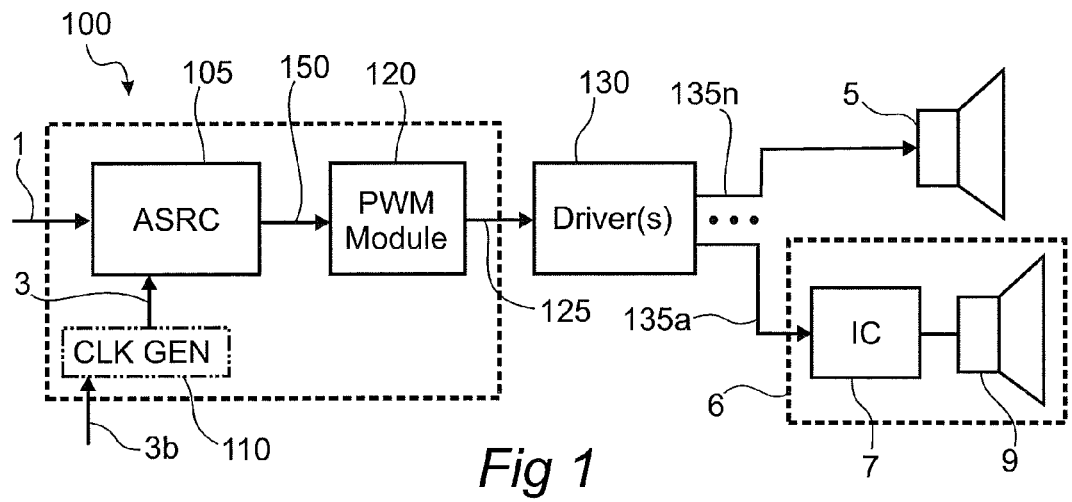
FIG. 1 shows a signal processing system including a signal conversion system in accordance with the present disclosure.

Particular embodiments of the present disclosure are described hereinbelow with reference to the accompanying drawings; however, the disclosed embodiments are merely examples of the disclosure and may be embodied in various forms. Well-known functions or constructions are not described in detail to avoid obscuring the present disclosure in unnecessary detail. Therefore, specific structural and functional details disclosed herein are not to be interpreted as limiting, but merely as a basis for the claims and as a representative basis for teaching one skilled in the art to variously employ the present disclosure in virtually any appropriately detailed structure. Like reference numerals may refer to similar or identical elements throughout the description of the figures.

Some aspects described herein are associated with "arbitrary" sampling rates (e.g., arbitrary source or destination sampling rates). As used here, the term "arbitrary" may refer to any sampling rate that is not pre-determined (e.g., that is not known when a sample rate conversion system is designed). It is understood that in some other aspects described herein the sampling rates may also pertain to "fixed rate" and predetermined sample rate implementations.

Moreover, as used herein lowercase variables will declare sequences in the time domain, while uppercase variables will declare frequency representations (e.g., x is a sequence represented in the time domain while X is the same variable represented in the frequency domain). The subscript $_n$ is used to represent the time index of sequences in the time domain (e.g. $x_n$). Different subscript letters are used to represent different sample rates related to a time index of sequences in the time domain (e.g. $x_n$, $y_b$, $z_k$, etc.).

A signal processing system in accordance with the present disclosure may be integrated into a consumer electronic device such an active loudspeaker, an amplifier, as cellular phone (e.g. a smartphone), a tablet computer, a laptop computer, a portable media player, a television, a portable gaming device, a gaming console, a gaming controller, a remote control, an appliance (e.g. a toaster, a refrigerator, a bread maker, a microwave, a vacuum cleaner, etc.) a power tool (a drill, a blender, etc.), a robot (e.g. an autonomous cleaning robot, a care giving robot, etc.), a toy (e.g. a doll, a figurine, a construction set, a tractor, etc.), a greeting card, a home entertainment system, etc. The signal processing system may be configured to maintain acceptable audio performance in a low cost application when paired with an exceedingly low cost transducer. In the case of a mobile or battery operated consumer electronic device, such as a portable gaming device, the signal processing system may be configured to enhance the audio experience for the user while minimizing power usage, thus extending the battery life, reducing onboard heat generation, etc.

FIG. 1 shows a signal processing system including a signal conversion system 100 in accordance with the present disclosure. The signal processing system accepts a wired or wireless input signal 1 (e.g. a digital signal, one or more analog signals, a 5.1 surround sound signal, an audio playback stream, etc.) provided by an external audio source (e.g. a processor, an audio streaming device, an audio feedback device, a wireless transceiver, an ADC, an audio decoder circuit, a DSP, etc.). The signal processing system may also generate a clock signal 3 by an included clock generation unit 110 and/or accept an external clock signal 3b from an external clock source. The signal processing system includes an optional asynchronous sample rate converter (ASRC) 105 in accordance with the present disclosure, to convert the input signal 1 from an input sample rate into a resampled signal 150. The system includes a pulse width modulation (PWM) module 120 in accordance with the present disclosure configured to accept the resampled signal 150 and produce a pulse width modulated (PWM) signal 125. The signal processing system may include one or more drivers 130 configured to accept the PWM signal 125 and generate driving signals 135a-n for driving one or more transducers 5, 9 and/or transducer modules 6.

The PWM module 120 may generate a carrier signal internally, the carrier signal having a resolution (e.g. m bits, m an integer greater than 0), a carrier frequency (e.g. related to the period of repetition of the carrier signal), and may be updated at a rate substantially higher than the carrier frequency (e.g. updated at the frequency of the clock signal 3 or at a rate derived therefrom). In one non-limiting example, the carrier signal may be updated at the frequency of the clock signal 3, and have a carrier frequency determined by the division of the clock signal 3 frequency by the resolution of the carrier signal.

In aspects, the configuration shown in FIG. 1 may be used without the ASRC 105. In one non-limiting example, the system may be configured to accept a signal 150 from the external audio source 1 instead of via the ASRC 105. In this case, the signal 150 may already be sampled at a rate suitable for use by the PWM module 120. The signal 150 may be of arbitrary and/or fixed sample rate (e.g. a signal with arbitrary sample rate, the sample rate significantly higher than the carrier signal frequency, 8× higher, 16× higher, 256× higher, etc., with a fixed sample rate, such as a rate equal to the clock signal 3 frequency).

In aspects, a PWM module 120 in accordance with the present disclosure may be advantageous for providing effective, low noise generation of PWM signals 125 at an a low overall PWM frequency. Such lowered PWM frequency may allow for decreased switching related losses in the system and lead to considerably increases efficiency.

In aspects, the input signal 1 may be highly oversampled with respect to, yet synchronous with, the carrier frequency (e.g. 256× the carrier frequency). The signal may be synchronously updated with the PWM carrier such as in a configuration where the signal conversion system acts as the I2S master aspect of an analog to digital converter.

In aspects, the driver(s) 130 may be half bridge or full bridge configuration, and may accept one or more PWM signals to drive either the corresponding high and low side drivers. The driver(s) 130 may include a class D amplifier, a balanced class D amplifier, a class K amplifier, or the like. The driver(s) 130 may include a feedback circuit for determining a current flow, voltage, etc. delivered to the transducer(s) during use. The amplifier may include a feedback loop, optionally configured to reduce a nonlinearity in one or more transducers 5, 9 and/or electrical components in the system.

A transducer 5, 9 may be a component or device such as a loudspeaker suitable for producing sound. More generally, a transducer 5, 9 may be any device configured to convert an input signal of a first energy form (e.g. an electrical input signal) into an output signal of a second energy form (e.g. acoustic, thermal, light, RF, electrical, etc.). With respect to an audio application, a transducer 5, 9 can be based on one of many different technologies such as electromagnetic, thermoacoustic, electrostatic, magnetostrictive, ribbon, audio arrays, electroactive materials, and the like. Transducers 5, 9 based on different technologies may require alternative driver characteristics, matching or filtering circuits but such aspects are not meant to alter the scope of this disclosure.

A transducer module 6 may be configured as a subsystem including both a transducer 9 and a circuit 7. The circuit 7 may provide additional functionality (e.g. power amplification, energy conversion, filtering, energy storage, etc.) to enable a driver external to the transducer module 6 to drive the transducer 9. Some non-limiting examples of the circuit 7 (e.g. a filter circuit, an LC filter, an amplifier, a de-multiplexer, a switch array, a serial communication circuit, a parallel communication circuit, a FIFO communication circuit, a charge accumulator circuit, etc.) are highlighted throughout the present disclosure.

In aspects, the signal processing system or a portion thereof may be embedded in an application specific integrated circuit (ASIC) or be provided as a hardware descriptive language block (e.g. VHDL, Verilog, etc.) for integration into a system on chip (SOC), application specific integrated circuit (ASIC), a field programmable gate array (FPGA), or a digital signal processor (DSP) integrated circuit. One or more units or portions thereof (e.g. ASRC, PWM module, etc.) may also be implemented in software on a consumer electronic device and/or in an associated network (e.g. a local network server, in the cloud, etc.). The signal processing system, and/or the signal conversion system 100 may be an all-digital hardware implementation. A hardware implementation may be integrated into any semiconductor manufacturing process, some non-limiting examples including 13 nm-0.5 μm CMOS, CMOS-Opto, HV-CMOS, SiGe BiCMOS, etc. This may be advantageous for providing an enhanced audio experience from a consumer electronic device without significantly impacting power consumption or adding significant hardware or cost to an already constrained device.

In aspects, an all-digital implementation may be advantageous to reduce the hardware footprint, reduce power consumption, reduce production costs, and increase the number of integrated circuit processes into which the system may be implemented. The implementation may be integrated into a consumer electronic device as part of a complete audio enhancement solution.

Figure 2A:
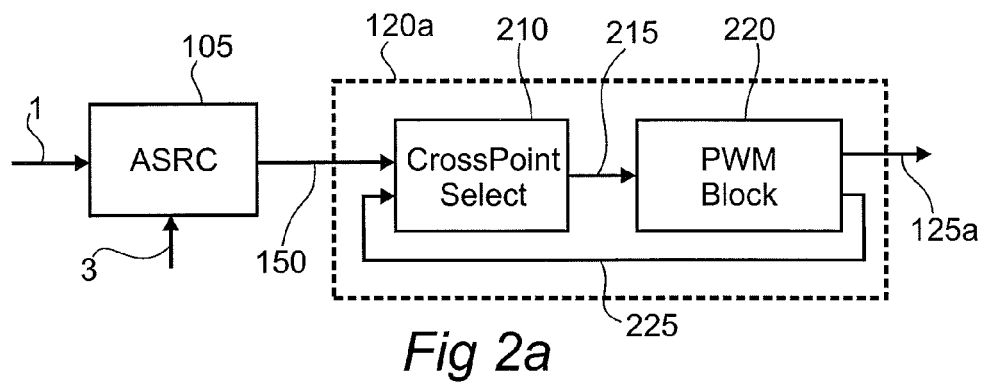
FIGS. 2a-b show non-limiting examples of signal conversion systems in accordance with the present disclosure.
Figure 2B:
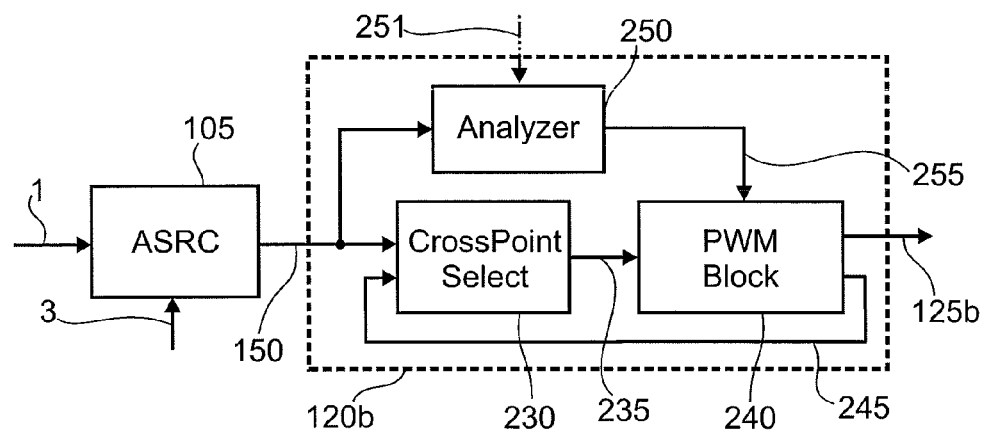

FIGS. 2a-b show non-limiting examples of signal conversion systems in accordance with the present disclosure. FIG. 2a shows a signal conversion system including an ASRC 105 in accordance with the present disclosure. The ASRC 105 is configured to accept an input signal 1 and a clock signal 3 and configured to generate a resampled signal 150. The signal conversion system includes a PWM module 120a including a cross-point section (CPS) block 210 and a PWM block 220, the PWM block 220 configured to accept a triggered signal 215 from the CPS block 210 and to generate a PWM signal 125a and a carrier signal 225. The CPS block 210 is configured to accept the resampled signal 150 from an ASRC 105 in accordance with the present disclosure or from an equivalent signal source and the carrier signal 225 and to produce the triggered signal 215. Such a configuration may be advantageous for reducing the intermodulation distortion and/or total harmonic distortion normally introduced by digital PWM systems. In one non-limiting example the resampled signal 150 may be provided by a signal source 1 instead of by the ASRC 105.

The CPS block 210 may include input and/or output registers to store samples of the resampled signal 150 and triggered signal 215 respectively. The CPS block 210 may include a CPS comparator, configured to compare the resampled signal 150 with the carrier signal 225. In one non-limiting example, the CPS comparator may be configured to update the triggered signal 215 when the carrier signal 225 transitions from being less than to being greater than the resampled signal 150. In another non-limiting example, the CPS block 210 may include a hysteresis function to limit potential noise induced switching of the triggered signal 215 when the carrier signal 225 and the resampled signal 150 are similar in magnitude. Such comparative function may be provided by a switching comparison algorithm, a hardware comparator element, etc. The CPS block 210 may be configured to update the triggered signal 215 in sync with the carrier signal 225 (e.g. when the carrier signal is at a maximum, a minimum, etc.).

The CPS block 210 may include a noise shaping function (e.g. a noise shaper), configured to insert and/or reshape a random and/or pseudo random noise in the switching comparison algorithm. Such random and/or pseudo random noise may be advantageous for reducing timing related noise on the resampled signal (i.e. thus potentially reducing the overall IMD and/or THD for the signal processing system). Alternatively, additionally, or in combination the noise shaping function may be included in the PWM block 220 instead of the CPS block 210. In one non-limiting example the noise shaping function may be an $n^{th}$ order Δ-Σ noise shaper. Each feedback loop in the noise shaper may include a configurable parameter to better help shape the overall noise. In one particular non-limiting example, a $9^{th}$ order noise shaper is used in combination with an absolute threshold of hearing model in order to shape the noise over the audible hearing range. Such a configuration may be advantageous to substantially minimize the audible noise in the system as would be heard by a human user. The noise shaper may be sampled at a frequency higher than the frequency of the carrier signal (e.g. at the clock frequency, at a multiple of the carrier signal frequency, etc.). Such high frequency sampling may be advantageous for shifting the noise to higher, inaudible frequency bands with the noise shaper during operation.

The CPS block 210 may be configured to accept multiple resampled signals 150, perhaps representative of the same signal provided at multiple sampling rates. Such multi-rate resampled signals 150 maybe compared with an associated carrier signal 225 in order to generate one or more triggered signals 215, with more precise and/or accurate representation of an intended ideal PWM output. Multi-rate resampled signals may be assessed by a sigma-delta block included in the CPS block 210 in order to better remove timing/sampling induced noise therefrom.

The CPS block 210 and/or the PWM block 220 may include a shaping function, configured to alter the PWM trigger timing so as to further reduce and/or compensate for associated nonlinearities that may affect the THD or IMD of the signal conversion system. Such a shaping function may be combined with a psychoacoustic effect in order to enhance one or more frequency bands (e.g. the bass band) of the resampled signal 150. Such a configuration may be advantageous for combining signal enhancement and signal conversion processes in order to reduce hardware requirements for an intended application.

In aspects, the shaping function may be configured to accept and/or analyze one or more properties of the resampled signal 150 (e.g. power level, band limited power levels, frequency content, etc.), the output of the shaping function being dependent upon the property.

The PWM block 220 may include IO registers, an optional noise shaping function, a carrier generator, and/or a PWM signal converter. The PWM signal converter may be configured to accept the triggered signal 215 or a signal derived therefrom, and to generate the PWM signal 125a. Additionally, alternatively, or in combination, the PWM signal converter may include a shaping function in accordance with the present disclosure, to further reduce IMD and/or THD. In aspects, the resampled signal 150 (or a substantially equivalent input signal), and triggered signal 215 may be high resolution pulse code modulated (PCM) signals (e.g. 16 bit, 18 bit, 24 bit, etc.) and the PWM signal 125a may be a 1 bit PWM signal. A noise shaper may be included in the PWM block 220 to shape the quantization noise associated with clock limited conversions and bit resolution reduction between the PCM and PWM signal(s).

FIG. 2b shows aspects of a non-limiting example of a signal conversion system in accordance with the present disclosure. The signal conversion system includes an ASRC 105 in accordance with the present disclosure. The ASRC 105 is configured to accept an input signal 1 and a clock signal 3 and configured to generate a resampled signal 150. The signal conversion system includes a PWM module 120b including a cross-point section (CPS) block 230, an analyzer 250, and a PWM block 240, The analyzer 250 is configured to calculate one or more properties (e.g. power level, band limited amplitudes, frequency response, harmonic content, etc.) from the resampled signal 150 and produce a PWM control signal 255. The PWM block 240 may be configured to accept a triggered signal 235 from the CPS block 230 and the PWM control signal 255 from the analyzer 250, and to generate a PWM signal 125b and a carrier signal 245. The CPS block 230 is configured to accept the resampled signal 150 and the carrier signal 245 and to produce the triggered signal 235. Such a configuration may be advantageous for reducing the intermodulation distortion and/or total harmonic distortion normally introduced by digital PWM systems.

The analyzer 250 may be configured to accept one or more external inputs 251. Some suitable non-limiting examples of external inputs include sensory signals (e.g. ambient temperature, humidity, sound level, loudspeaker feedback signals, etc.), output voltage levels, speaker current levels, enclosure temperature, enclosure pressure levels, etc. In aspects, such external inputs 251 may be used by the analyzer 250 to improve power supply noise levels (pulse rejection, etc.) so as to increase the power supply rejection ratio (PSRR).

With integration of an external input 251, the analyzer 250 may include a model of one or more loudspeakers and/or drivers in the signal path. The model may be adaptable based on the information provided in the external input 251. Such a model may be advantageous for further reducing the IMD and/or THD based upon the operating environment, and/or for optimizing the operating characteristics of one or more system components (e.g. a driver, a loudspeaker, a power supply, etc.). Such a configuration may be particularly useful in overcoming variation of speaker parameters (e.g. impedance, damping, efficiency, performance characteristics, etc.) due to changes in local temperature, humidity, etc.

In aspects, the analyzer 250 may be configured to generate one or more properties of the resampled signal 150. Some non-limiting examples of such properties include the signal power levels, band limited amplitudes (e.g. bass band amplitude), frequency response, harmonic content, and the like. The analyzer 250 may generate a PWM control signal 255 for use in the PWM block 240. The PWM control signal 255 may be used to alter one or more characteristics of the carrier signal 245 (e.g. carrier frequency, modulation index, waveform, etc.) and/or one or more aspects of an associated shaping function.

In aspects, the analyzer 250 may be configured to extract an overall power level from the resampled audio signal 150. The overall power level may be provided as is or modified before being released as a PWM control signal 255. The PWM converter 240 may be configured to accept the power level into an included shaping function. The shaping function may be configured to adjust the timing of the PWM signal 125a when the PWM control signal 255 is above a power limit, below a power threshold, etc. Such a configuration may be advantageous for extending the linear range of the drivers and/or transducers. It may also be advantageous for providing a high quality PWM signal at a lower carrier frequency than is acceptable with traditional PWM systems.

In aspects, the shaping function, included in the PWM block 220, 240 or CPS block 210, 230, may be configured to provide such functions as FIR filtering, IIR filtering, warped FIR filtering, transducer artifact removal, disturbance rejection, user specific acoustic enhancements, user safety functions, emotive algorithms, psychoacoustic enhancement, signal shaping, single or multi-band compression, expanders or limiters, watermark superposition, spectral contrast enhancement, spectral widening, frequency masking, quantization noise removal, power supply rejection, crossovers, equalization, amplification, driver range extenders, power optimization, linear or non-linear feedback or feed-forward control systems, and the like. The shaping function, included within a CPS block 210,230 and/or an associated PWM block 220, 240 may include one or more of the above functions, either independently or in combination.

In one non-limiting example, particularly related to the processing of an audio signal, the shaping function may be configured to add or subtract in-audible power to/from the PWM signal (i.e. power with frequency content outside of the audible spectrum) dependent upon the overall power and/or level of the resampled signal 150. Such a configuration may be used to artificially increase the duty cycle of the PWM signal without affecting the audible portion of the resulting signal. This may be advantageous for reducing THD introduced when the resampled signal 150 is near a limit (a minimum and/or maximal power level), or the modulation index is particularly high. By adding or subtracting in-audible power to the PWM signal, particularly short pulses may be extended and/or altered such that the associated switching losses, quick transition related power loss, etc. may be better compensated for in real-time to enhance the audible portion of the signal produced by the system.

In aspects, the PWM block 220, 240 may be configured to generate a carrier signal 225, 245. The carrier signal 225, 245 may have a carrier frequency, an amplitude (i.e. so as to determine an associated modulation index), and a waveform (e.g. a sawtooth, a triangular waveform, a sinusoidal signal, etc.). The carrier signal 225, 245 may be generated in sync with the clock signal 3, in sync with an arbitrary clock source, from one or more clock signals generated within the ASRC 105, with feedback from an associated analyzer 250, in sync with an input signal 1, etc.

The PWM block 220, 240 may include one or more modulation schemes including sigma-delta modulation, audio band noise shaping, pulse-width-modulation, bang-bang control schemes, dithering PWM, modified PWM schemes, sliding mode control, or the like. In one non-limiting example, a sliding mode control (SMC) approach may allow for higher PSRR and BW than other methods. The SMC is based upon the notion of a sliding surface about which a hysteresis is provided to generate a corrective signal whenever the target moves more than the hysteresis distance from the sliding surface.

The carrier sampling frequency may be dependent upon the modulation index. A moving average of the modulation index may be generated by the analyzer during operation, and used to control the PWM process and/or a shaping function.

In aspects, the PWM block 220, 240 may include a dead time compensation function. Such a function may compensate for dead-time of the driver(s) 130, transducers 5, 9 and/or drive circuits 7 in order to further extend the linear range of the signal conversion system. Such dead time compensation may be typically in the range of 100 ns-1 us.

Figure 3:
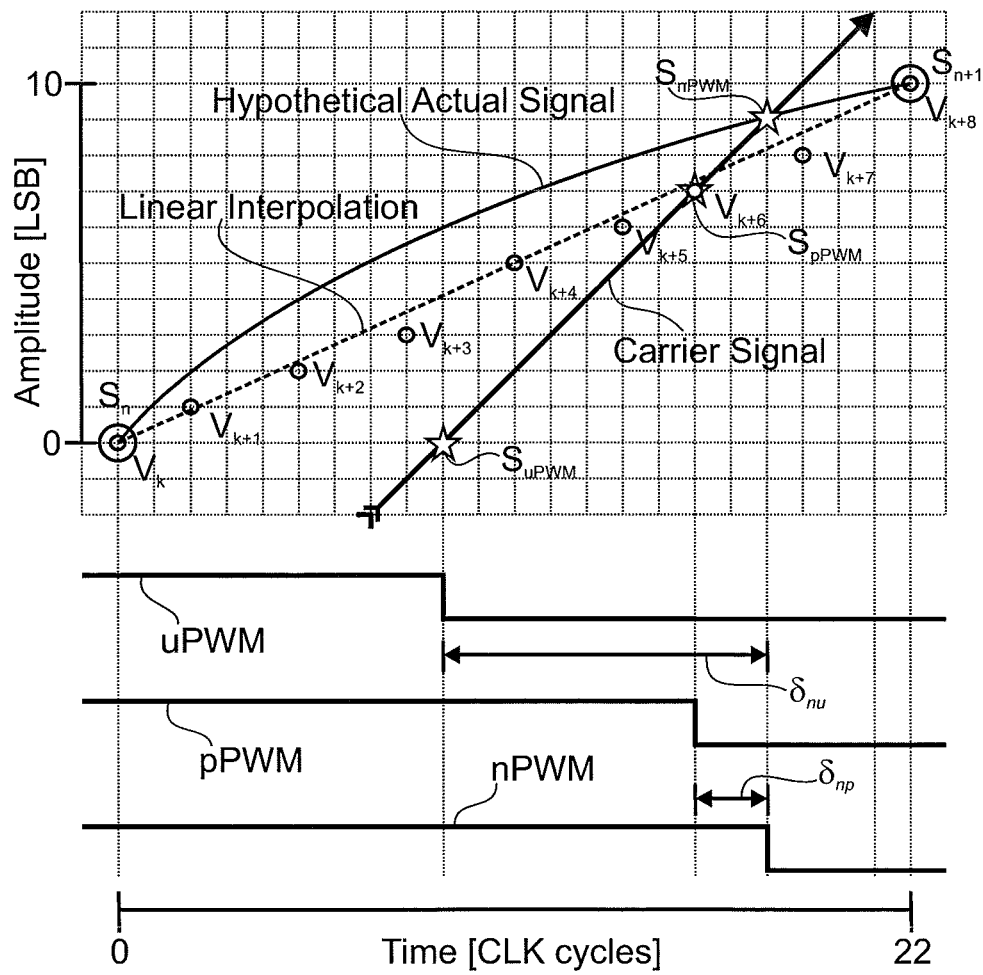
FIG. 3 shows a time series signal comparison between natural PWM, digital PWM, and a preconditioned PWM method in accordance with the present disclosure.

FIG. 3 shows a time series signal comparison between natural PWM, digital PWM, and a preconditioned PWM method in accordance with the present disclosure. The amplitude axis is divided into least significant bits, representing the desired precision of the signal. In this example, 22 clock cycles are shown between successive input samples. The time series of the input signal is represented by successive samples $s_n$ and $s_{n+1}$. In this non-limiting example, the input samples $s_{n+1}$ and $s_n$ are separated by 22 clock cycles. The time series of the resampled signal 150 is represented by successive samples $v_k$ to $v_{k+4}$. A hypothetical actual signal is indicated with the solid line extending from $s_n$ and $s_{n+1}$. An associated linear interpolation is shown with the dashed line and an associated resampled signal v, is indicated at each sample point (in this non-limiting example, the resampled signal is up sampled by a factor of 8×). The carrier signal 225, 245 is shown with a thick solid line as it passes through the vicinity of the signals (hypothetical actual signal, linear interpolation, and resampled signal).

The resampled signal shown in FIG. 3 may be generated by an ASRC 105 in accordance with the present disclosure. The first sigma delta loop included in the sample rate converter 105 generates the temporal spacing of series k from the temporal time series n and the desired ratio between the series k and series n sample rates (in this case an integer value, 8). As seen in FIG. 3, the resampled output signal samples are spaced at 2, 3, 3, 3, 3, 2, 3, and 3 clock cycles respectively. The second sigma delta loop generates the amplitudes of the output samples from the input samples and the ratio between the sample rates of the input signal and resampled output signal. As seen in FIG. 3, the output sample amplitudes are 1, 2, 3, 5, 6, 7, 8, and 10 respectively. The function of the sigma delta loops is further elucidated below:

TABLE 1

Sigma Delta Example: Both sigma delta loops with interpolation factor of 8:

| First sigma delta unit (temporal) | Second sigma delta unit (amplitude) |
|---|---|
| Sample time difference is: | Sample amplitude difference is: |
| T_Diff = $T_{n+1} - T_n$ = 22 | S_Diff = $s_{n+1} - s_n$ = 10 |
| T_DiffDiv = T_Diff/8 = 2.75 | S_DiffDiv = S_Diff/8 = 1.25 |
| Thus, the time should be incremented by 2.75 CLK cycles for every new interpolated sample to spread them evenly between the samples $S_{n+1} - S_n$. To synchronize output with the clock signal, the sigma delta will generate samples only at integer values, and spread the truncation error over samples. | Thus the signal amplitude should be incremented by 1.25 amplitude steps for every new interpolated sample to spread them evenly between $S_{n+1} - S_n$. To keep the system precision equal to the input signal, the sigma delta will only generate integer values for each increment, and spread the truncation error over the samples. |
| Output clock cycles to wait between samples generated by the first sigma delta: | Output increment generated by the second sigma delta: |
| $V_{k+1}$: 2 | $V_{k+1}$: 1 |
| $V_{k+2}$: 3 | $V_{k+2}$: 1 |
| $V_{k+3}$: 3 | $V_{k+3}$: 1 |
| $V_{k+4}$: 3 | $V_{k+4}$: 2 |
| $V_{k+5}$: 3 | $V_{k+5}$: 1 |
| $V_{k+6}$: 2 | $V_{k+6}$: 1 |

TABLE 1-continued

Sigma Delta Example: Both sigma delta loops with interpolation factor of 8:

| First sigma delta unit (temporal) | Second sigma delta unit (amplitude) |
|---|---|
| $V_{k+7}$: 3 | $V_{k+7}$: 1 |
| $S_{n+1}$: 3 | $S_{n+1}$: 2 |

Overlaid onto the chart are curves depicting a hypothetical actual signal (solid line) and an ideal linear interpolation (dotted line). As can be seen in FIG. 3, the interpolated sample points $v_{k+1}$ to $v_{k+7}$ approximate the linear interpolation both in amplitude and in time. The first sigma delta loop included in an ASRC in accordance with the present disclosure ensures that the conversion is time perfect, in that the remainder from each approximation is maintained in the loop for contribution to subsequent samples. Similarly, the sub LSB amplitude variations of the second sigma delta loop included in the ASRC are maintained as remainders for contribution to successive samples.

In an ideal pulse width modulator, the carrier signal would cross the hypothetical signal at the point $S_{nPWM}$. In an uncompensated digital pulse width modulator, the carrier signal would effectively intersect the input signal 1 at the point $S_{uPWM}$, which is considerably different from the ideal intersection. The error between the ideal crossing point and $S_{uPWM}$ is shown in FIG. 3 as $\delta_{nu}$. This error contributes to the THD and IMD of the system and may negatively affect the user experience for an associated consumer electronics device.

In accordance with the present disclosure, the CPS block 210, 230 may be configured to generate a triggered signal 215, 235 based upon when the carrier signal 225, 245 intersects with the resampled signal 150. This is shown in FIG. 3 as point $S_{pPWM}$ and differs from the ideal intersection by a timing error of $\delta_{np}$. The compensated error $\delta_{np}$ may be considerably smaller than the error associated with the uncompensated PWM, thus the IMD and THD of the processing system may be reduced accordingly.

Figure 4:
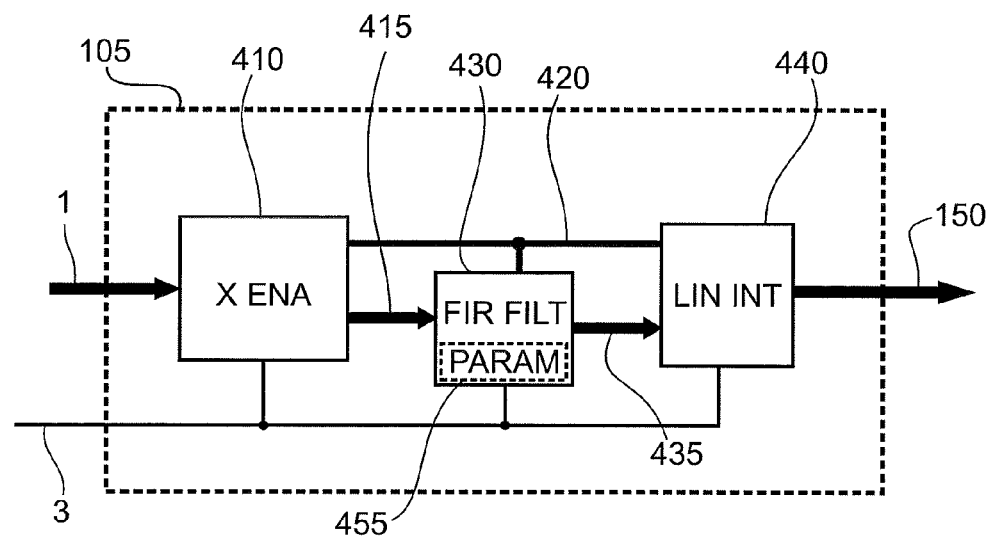
FIG. 4 shows a sample rate converter in accordance with the present disclosure.

FIG. 4 shows a sample rate converter 105 in accordance with the present disclosure. The sample rate converter 105 is configured to convert an input signal 1 with a first sample rate to a resampled signal 150 with a resampled rate, and includes a cross enable unit 410, a finite impulse response (FIR) filter module 430, and a linear interpolation unit 440. The sample rate converter 105 may also be configured to accept, or generate internally a clock signal 3 that may be used during the conversion process. The cross enable unit 410 is configured to accept the input signal 1 and produce one or more resampled clock signals 420 and a de-jittered signal 415. The FIR filter module 430 is configured to produce a filtered intermediate signal 435 from one or more of the resampled clock signals 420, optionally the clock signal 3, and the de-jittered signal 415. The linear interpolation unit 440 is configured to accept one or more resampled clock signals 420 and the filtered intermediate signal 435 and configured to produce the resampled signal 150 at an output sample rate.

Although FIG. 4 shows a single input signal 1, de-jittered signal 415, filtered intermediate signal 435, and resampled output signal 150, multiple signals may be considered within the spirit of the disclosure and signals may often be referred to in singular or plural form as particular to the discussion at hand.

Although FIG. 4 shows a FIR filter module 430 connected between the cross enable unit 410 and the linear interpolation unit 440, in one non-limiting example, the FIR filter module 430 may be removed and the de-jittered signal 415 connected directly to the linear interpolation unit 440 without altering the scope of the disclosure. In this example, the linear interpolation unit 440 is configured to accept the de-jittered signal 415 directly instead of the filtered intermediate signal 435.

In aspects, the cross enable unit 410 may be configured to accept one or more input signals 1 (e.g. a digital signal, a digital audio stream, a telemetry signal, etc.) from a signal source (e.g. output of an analog to digital converter, a signal processor, an SPDIF converter, an I2S converter, etc.), and to produce one or more resampled clock signals 420 and a de-jittered signal 415. The input signals 1 may have one or more associated first sample rates. The cross enable unit 410 may also be configured to accept and/or to generate internally a clock signal 3 (e.g. a system clock). The cross enable unit 410 may be configured to produce one or more resampled clock signals 420, generated from one or more of the input signals 1 in combination with the clock signal 3.

In aspects, the clock signal 3 may have a significantly higher sample rate than the input signal 1, the resampled signal 150 or intermediate signals generated during the conversion process. The clock signal 3 may be formed by a frequency synthesizer, a PLL, an RC oscillator, a crystal oscillator, or the like.

The sample rates of the resampled clock signals 420 may be preconfigured multiples of the averaged input sample rates (e.g. integer multiples, non-integer multiples, rational non-periodic variable multiples, etc.), associated with the input signals 1. Alternatively, one or more of the resampled clock signals may be deterministically related to the clock signal 3 so as to provide a known sample rate irrespective of shifts and/or fluctuations in the first sample rate.

The resampled clock signals 420 may be used by one or more of the units (e.g. the FIR filter module 430, the linear interpolation unit 440, etc.) within the sample rate converter 105 to perform aspects of the sample rate conversion. The resampled clock signals 420 may also be provided as outputs to other systems (e.g. for further signal processing, for use in an associated PWM block 220, 240 timing operations, parameter calculation, input signal quality assessment, etc.).

The cross enable unit 410 may produce a de-jittered signal 415 and associated de-jittered clock signal (e.g. a resampled clock signal 420) substantially sampled at the mean value of the first sample rate. The de-jittered signal 415 may be advantageous in applications where the input signal 1 has a jittery, asynchronous, unreliable, or otherwise variable first sample rate, as well as in applications where high performance demands are placed on signal processing aspects of the system.

The FIR filter module 430 may include a FIR filter (not explicitly shown) and one or more parameters 455 for adjusting the properties of the FIR filter. The FIR filter may be configured as a low pass filter, a band-pass filter, or the like. In one non-limiting example, the FIR filter may be implemented as a computationally efficient low pass polyphase FIR filter. The FIR filter may be an adaptive and/or reconfigurable filter, the properties of which may be adjusted by an external system, by an adaptation algorithm, the parameters 455, or the like. In aspects, reconfigurable filter parameters 455 may be stored in the sample rate converter and/or may be updated externally or internally, potentially in real-time.

The resampled clock signal generator 550 may be configured to accept reconfigurable parameters from an external source. Alternatively, in combination, or in addition, the resampled clock generator 550 may include a non-periodic rate converting element (e.g. a pseudo random number generator, etc.). The non-periodic rate converting element may be used to create a spread spectrum sample rate, or the like. Such aspects may be advantageous for decreasing the peak electromagnetic radiation operably emitted from the sampling system, etc.

Figure 5:
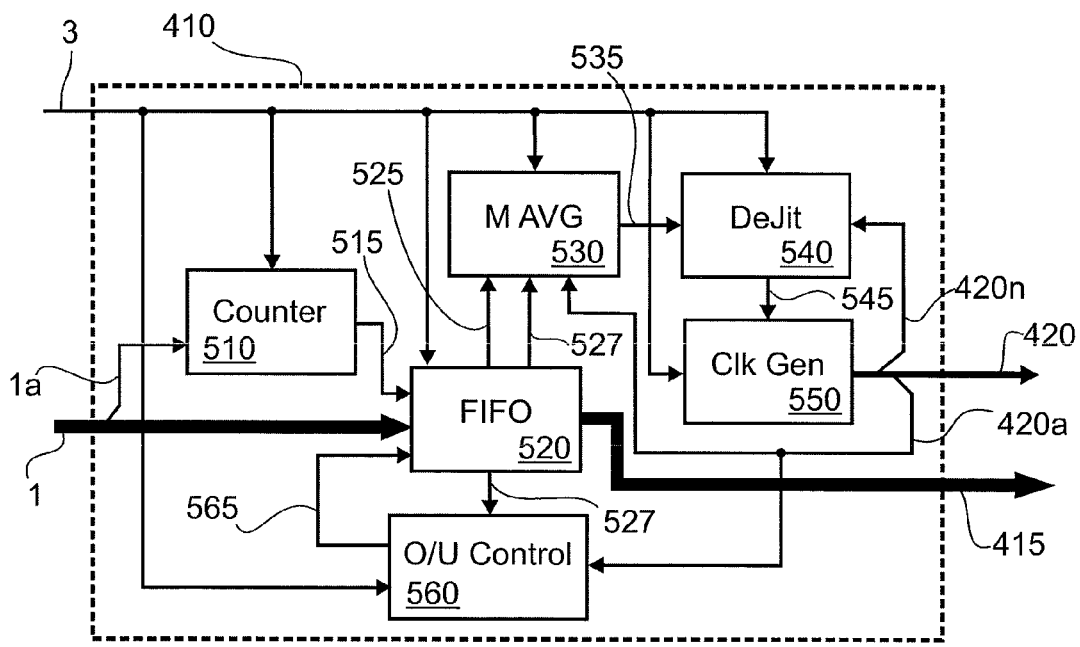
FIG. 5 shows a cross enable unit in accordance with the present disclosure.

FIG. 5 shows a cross enable unit 410 in accordance with the present disclosure. The cross enable unit 410 includes a counter 510, a FIFO buffer 520, an averaging block 530, a first sigma-delta loop 540, a resampled clock generator 550, and a FIFO fill control 560 (equivalently included within the FIFO buffer 520). The counter 510 is configured to count the number of clock cycles on the clock signal 3 between adjacent samples of the input signal 1 to form a count-disparity signal 515. The counter 510 may accept the input signal 1 directly and/or an input signal enable bit 1a (as shown).

The FIFO buffer 520 may be configured to stores samples of the input signal 1 and/or the count-disparity signal 515 associated with each sample of the input signal 1 for use by other blocks in the cross enable unit 410. The FIFO buffer 520 may be configured to deliver count-disparity samples 525 to the averaging block 530. The FIFO buffer 520 may be configured to generate a fill value 527 that corresponds to how full the FIFO buffer 520 is with count-disparity values 525 and/or corresponding samples of the input signal 1.

The averaging block 530 may be configured to calculate the moving average of the count-disparity values 525 to form an averaged count-disparity signal 535. The averaging block 530 may include a FIR filter, boxcar average, an infinite impulse response (IIR) low pass filter, or the like to achieve this functionality. The first sigma-delta loop 540 may be configured to accept the clock signal 3, the averaged count-disparity signal 535 and one or more intermediate clock signals 420n (as feedback from the resampled clock generator 550). From these inputs, the first sigma delta loop 540 may be configured to generate the number of clock cycles that should be inserted between input samples at the desired resample rate from the averaged count-disparity signal 535 to form a temporal correction signal 545. The resampled clock generator 550 may be configured to accept the temporal correction signal 545, the clock signal 3, and to construct one or more resampled clock signals 420 (e.g. one or more intermediate clock signals 420n, a de-jittered clock signal 420a, etc.).

In addition or in combination, the de-jittered clock signal 420a may be used as feedback to release corresponding input samples from the FIFO buffer 520 at a de-jittered sample rate.

The FIFO fill control 560 may be configured to keep the FIFO buffer 520 from under or overflowing during operation. To achieve this function, the FIFO fill control 560 may accept a fill value 527 from the FIFO buffer 520, the de-jittered clock signal 420a, and the clock signal 3 and calculate a fill rate parameter 565. The fill rate parameter 565 may be used to advantageously time the release of samples into the FIFO buffer 520 to prevent under or over filling.

In aspects, the FIFO fill control 560 may be included in the moving average block 530 or between the FIFO buffer 520 and the moving average block 530. The FIFO fill control 560 may alter the count disparity signal 525 associated with each released audio sample before supplying it to the averaging block 530. The FIFO fill control 560 may alter the count disparity signal 525 based on the fill level of the FIFO buffer 520. In aspects, when the FIFO buffer 520 is half full, the FIFO fill control 560 may not alter the count disparity signal 525. Thus the FIFO release clock 420a may speed up or slow down to maintain the FIFO buffer 520 at a desired fill level.

In aspects, the de-jittered clock signal 420a may be fed back to the FIFO fill control 560, into the FIFO buffer 520, the averaging block 530, and the first sigma-delta loop 540 as a trigger to synchronize calculations within the cross-enable unit 410 and to provide a more stable sample rate for signal processing than may be available from the input signal 1 directly. This approach may be advantageous for improving system performance by substantially removing jitter induced error propagation from the input signal 1 that may otherwise pass along through a signal processing system, etc.

In aspects, the first sigma delta loop 540 may be configured to accept the averaged count-disparity signal 535 from the averaging block 530 and generates a number of clock cycle transitions to wait between one or more resampled clock signals for the resampled clock generator 550. In general, the first sigma delta loop 540 may be configured to output the number of clock cycle transitions to be inserted between the highest resampled clock rate in the system. The first sigma delta loop 540 may be configured to retain this information as an internal value, which may include an integer part and a remainder part. The integer part may be delivered to the resampled clock generator 550 in the form a temporal correction value 545, while the remainder part may be internally cycled to be spread across subsequent samples. In this way, the first sigma delta loop 540 may be configured to spread the asynchronous aspects of the signal conversion over several samples while performing substantially a perfect conversion in an averaged time sense.

In aspects, the resampled clock generator 550 may be configured to accept the temporal correction value 545 commonly related to the maximum resampled clock rate in the system and to generate one or more resampled clock rates 420 for use by one or more units in the system. The resampled clock generator 550 may include an integer divider, a non-integer divider, etc.

The averaging block 530 may include an averaging function with a non-unity DC gain adjustment to produce a non-unity representation of the count-disparity signal. Such an arrangement may be suitable for forming non-integer resampled rates on one or more of the resampled clock signals. An adjustable gain may also serve as a feedback control signal to other elements of the cross enable unit (e.g. the FIFO buffer 520). In one non-limiting example, the averaging block 530 may include a moving average filter with an adjustable gain parameter. The FIFO buffer 520 may include a fill value proportional to the fill level of the FIFO buffer 520. The adjustable gain parameter may be controllably linked to the fill value. Thus the de-jittered sample rate may vary along with the fill level of the FIFO buffer 520, the relationship between parameters may be established such that the system is self-stabilizing, such that the FIFO buffer 520 fills to a mid-point and remains at the mid-point during operation.

In aspects, the first sigma-delta loop 540 may include one or more parameters suitable for modifying the count disparity value, or average count disparity value resampled temporal correction value. In one non-limiting example, the first sigma delta loop 540 may include an integer value parameter, such as a power of 2 (e.g. 16). In another non-limiting example, the first sigma-delta loop 540 may include a non-periodic, possibly random number generator (e.g. a pseudorandom Gaussian noise generator). Such a configuration may be advantageous for generating a spread spectrum sampling rate.

The cross enable unit 410 may include several of the above elements (e.g. FIFO buffer 520, sigma-delta loops 540, averaging blocks 530, etc.) arranged so as to form a range of multi-rate resampled signals, non-integer resampled signals, etc.

The cross enable 410 may further include a decimation unit for down sampling a signal to produce one or more resampled clock signals with a sample rate less than that of the input signal.

The cross enable 410 may be adapted to simultaneously manage de-jittering and/or resampled clock signal generation for multiple asynchronous input signals 1. Such a configuration may be advantageous for sensor fusion applications where a common phase delay must be maintained between several, potentially multi-rate input signals obtained from a range of sensory inputs.

Figure 6:
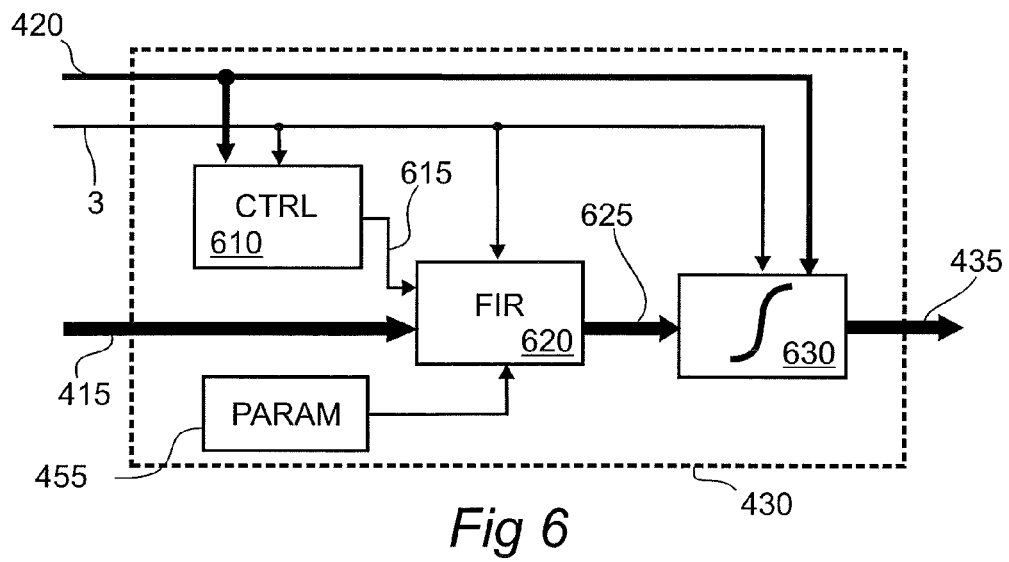
FIG. 6 shows a finite impulse response filter module in accordance with the present disclosure.

FIG. 6 shows a finite impulse response filter (FIR) module 430 in accordance with the present disclosure. The FIR filter module 430 includes a controller 610, a FIR filter 620 and limiter 630. The FIR filter module 430 is configured to accept a clock signal 3, one or more de-jittered signals 415, and one or more resampled clock signals 420. The FIR filter module 430 is configured to produce one or more filtered intermediate signals 435. The controller 610 may be configured to accept the clock signal 3 and one or more resampled clock signals 420 and to produce an intermediate clock signal 615 to drive the FIR filter 620. The FIR filter 620 may be configured to accept one or more de-jittered signals 415 at a sample rate determined by the intermediate clock signal 615 and to produce a first filtered signal 625. The limiter 630 may be configured to accept the first filtered signal 625 and to implement a saturation function to prevent overflow of the signal. The limiter 630 may be configured to output one or more filtered intermediate signals 435.

The FIR filter module 430 may include one or more parameters 455. The parameters 455 may be used to configure coefficients of the FIR filter 620 and/or the limiter 630.

The finite impulse response (FIR) filter module 430 may be configured to accept one or more resampled clock signals 420 and the de-jittered signal 415. The FIR filter module 430 may be configured to produce a filtered intermediate signal 625 at an intermediate sample rate corresponding to one of the resampled clock signals. The FIR filter module 430 includes a FIR filter 620 that samples the de-jittered signal 415 at a rate corresponding to one of the resampled clock signals 420. The FIR filter 620 may be configured as a low pass filter, a bandpass filter, or the like. In one non-limiting example, the FIR filter 620 may be implemented as a computationally efficient polyphase FIR filter.

The FIR filter 620 may include an adaptive and/or reconfigurable filter, the properties of which may be adjusted by an external system, by an adaptation algorithm, a parameter set, or the like. The reconfigurable filter parameters 455 may be stored in the sample rate converter 150 and/or may be updated externally or internally, potentially in real-time.

The FIR filter 620 may be implemented in a hardware descriptive language (HDL) to provide a structure with implicitly variable precision. A HDL implementation may be advantageous for simple inclusion of the sample rate converter 105 into a signal processing application specific integrated circuit (ASIC), a digital signal processor (DSP), a field programmable gate array (FPGA), or the like.

In aspects, the FIR filter 620 may include aspects of an inverse system model along with a low-pass function useful for removing aliasing artifacts from an up-sampled input signal. Such a FIR filter 620 may be advantageous for implementing a compensatory function with substantially minimized phase delay, improved computational efficiency, etc.

Figure 7:
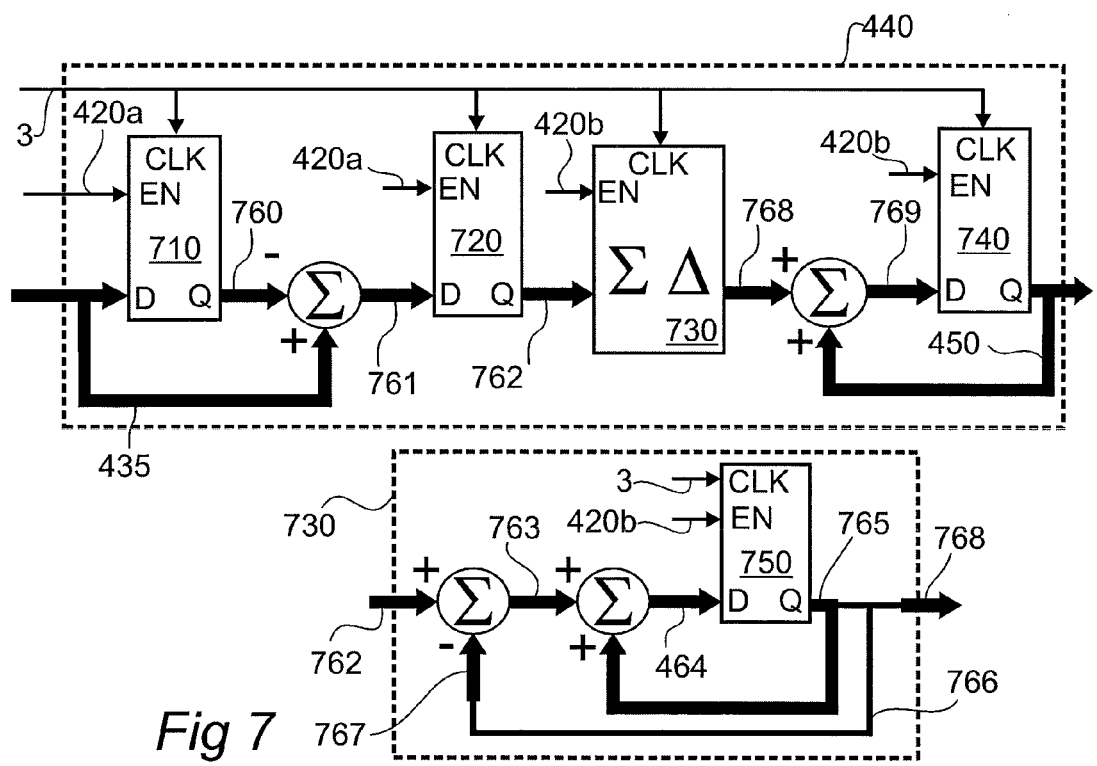
FIG. 7 shows a linear interpolation unit and a sigma delta block in accordance with the present disclosure.

FIG. 7 shows a linear interpolation unit 440 and a sigma delta block 730 in accordance with the present disclosure. The linear interpolation unit 440 is configured to accept one or more filtered intermediate signals 435, a clock signal 3, and one or more resampled clock signals 420a-b, and produce a resampled output signal 450 at an output sample rate.

The linear interpolation unit 440 may include one or more registers 710, 720, 740 to store a signal. The clock signal 3 may be provided to each of the registers 710, 720, 740 and blocks 730 within the linear interpolation unit 440 as a timing source. As shown in FIG. 7, the filtered intermediate signal 435 may be stored in the register 710 on each cycle of the first resampled clock signal 420a, to form a delayed signal 760. The delayed signal 760 may be subtracted from the filtered intermediate signal 435 to form a difference signal 761. The difference signal 761 may be stored in the register 720 on each cycle of the first resampled clock signal 420a. The stored difference signal 762 may be sampled by the sigma delta loop 730 on every cycle of the second resampled clock signal 420b. The sigma delta loop 730 may be configured to produce an output incremental signal 768 on each cycle of the second resampled clock signal 420b. The output incremental signal 768 may be added to the resampled output signal 450 on each cycle of the second resampled clock signal 420b to form an intermediate output signal 769 that is stored in a register 740, the intermediate output signal 769 also being stored on each cycle of the second resampled clock signal 420b. Thus the linear interpolation unit 440 generates a resampled output signal 450 at an output sample rate.

FIG. 7 also shows aspects of an example of a sigma delta loop 730 in accordance with the present disclosure. The sigma delta loop 730 may be configured to accept a clock signal 3 and the second resampled clock signal 420b. On each cycle of the second resampled clock signal 420b the sigma delta loop 730 may be configured to sample the stored difference signal 762 and subtracts from it a remainder signal 767 representing an integer portion of the correction signal 765 to produce first SDL intermediate signal 763, which may be added to the correction signal 765, the result being the second SDL intermediate signal 764, which may be stored in the register 750 on each cycle of the second resampled clock signal 420b. The correction signal 765 may be divided by a predetermined value (dependent on the desired output sample rate) to create an integer part 766. In the non-limiting example shown, the integer part 766 may be generated by a power of 2 division (e.g. division by 32), which is achieved by a bit shift. In a non-limiting example, where the goal is to provide a maximally re-sampled output signal, this division rate is real time variable that is updated with every sample of the input signal 1. The integer part 766 may be converted to an appropriate precision to create the output incremental signal 768 on every cycle of the second resampled clock signal 420b.

In aspects, the linear interpolation unit 440 may include a second sigma delta loop 730 configured to generate successive output samples from associated and/or adjacent samples of the filtered intermediate signal 435. The sigma delta loop 730 may be configured to calculate the correction signal 765 on each cycle of the resampled clock signal 420b. In general, the correction signal 765 may include an integer part 766 and a remainder part (shown as a portion of the second SDL intermediate signal 764). Upon each cycle of the second resampled clock signal 420b, the output incremental signal 768 may be added to the previous sample of the resampled output signal 450 to generate the current resampled output signal sample, while the remainder part is fed back into the sigma delta loop to maintain integrity of the conversion process over time.

In one non-limiting example, the linear interpolation unit 440 may include a second sigma delta loop configured to generate successive output samples from associated and/or adjacent samples of the filtered intermediate signal 435. The sigma delta loop may be configured to calculate a correction signal dependent on the sample rates of the resampled clock signals 420 and filtered intermediate signal 435. In general, the correction signal may include an integer part and a remainder part. Upon each cycle at the output sample rate, the integer part of the correction signal may be added to the previous resampled output signal sample to form the current resampled output signal sample, while the remainder part may be added back into the correction signal to maintain integrity of the conversion process over time.

The corresponding resampled output signal with an associated output sample rate may then be outputted from the sample rate converter for use elsewhere in a signal processing system, transfer to a PWM module 120, 120a, 120b in accordance with the present disclosure, a transducer driver circuit, or the like.

Figure 8:
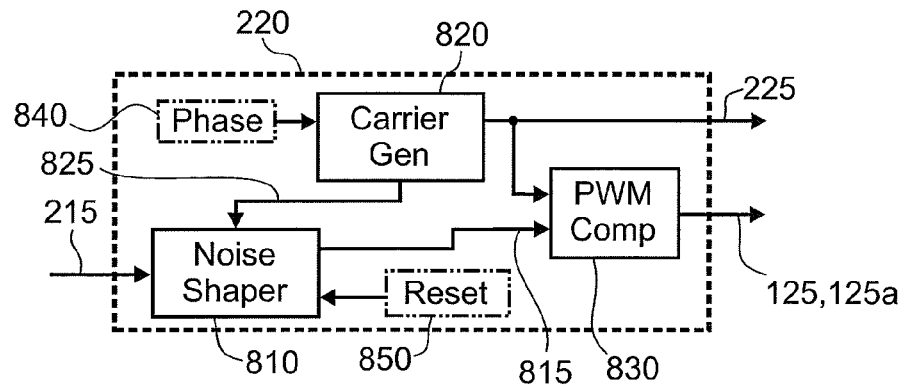
FIG. 8 shows a PWM block in accordance with the present disclosure.

FIG. 8 shows a PWM block 220 in accordance with the present disclosure. The PWM block 220 includes a noise shaper 810 configured to accept a triggered signal 215, an optional reset parameter 850, and an optional synchronization signal 825, and to generate a noise shaped signal 815. The PWM block 220 also includes a carrier generator 820 configured to generate a carrier signal 225 and the optional synchronization signal 825. The PWM block 220 further includes a PWM comparator 830 configured to accept the carrier signal 225 and the noise shaped signal 815 and to generate a PWM signal 125, 125a. In one non-limiting example, the components within the noise shaper 810 may be updated at a high sample rate (e.g. the clock signal 3 frequency) compared with the carrier signal 225 frequency, while the triggered signal 215 and the noise shaped signal 815 may be updated at a rate determined by a CPS block and/or a carrier signal 225 both in accordance with the present disclosure.

The synchronization signal 825 may be used to synchronize and/or control release of samples of the noise shaped signal from the noise shaper to the PWM comparator 830. The synchronization signal 825 may be updated in sync with the carrier signal 225 (e.g. when the carrier signal is at a maximum, at a minimum, etc.)

The carrier generator 820 may be configured to accept a phase parameter 840 to adjust the temporal offset of the carrier signal 225 (such as via adjusting the initial value of the carrier signal, etc.). Such temporal offset of the carrier signal 225 may be advantageous in synchronizing a plurality of PWM signals 125,125a as may be operationally generated by a plurality of PWM modules 120, 120a, 120b.

The PWM block 220 may include a shaping function in accordance with the present disclosure, to further reduce IMD and/or THD.

In aspects, the triggered signal 215 may be high resolution pulse code modulated (PCM) signals (e.g. 16 bit, 18 bit, 24 bit, etc.) and the PWM signal 125a is a 1 bit PWM signal. The shaping function may be a noise shaper 810 of any order (e.g. $2^{nd}$, $3^{rd}$, $4^{th}$, etc.). The noise shaper 810 may be configured to shape the noise in accordance with an absolute threshold of hearing model. Such a configuration may be advantageous for reducing the audible aspects of the quantization noise for a target human audience. The noise shaper 810 may be configured to truncate the triggered signal 215 during operation to form the noise shaped signal 815.

In aspects, the noise shaper 810 may generally be part of a bit-depth reduction process within the PWM module 120, 120a, 120b. In one non-limiting example the noise shaping function may be an $n^{th}$ order $\Delta$-$\Sigma$ noise shaper (e.g. a $3^{rd}$ order, $5^{th}$ order, $9^{th}$ order shaper, etc.). Each feedback loop in the noise shaper may include a configurable parameter to better help shape the overall noise, shape the frequency distribution of the noise (e.g. so as to generally minimize noise content in the most sensitive hearing bands, etc.), etc. In one non-limiting example, a $5^{th}$ order noise shaper may be used in combination with an absolute threshold of hearing model in order to shape the noise over the audible hearing range, so as to substantially minimize the audible noise in the system as would be heard by a human user. The noise shaper 810 may be sampled at a high frequency (e.g. the clock signal 3 sample rate, the input signal 1 sample rate, the resampled signal 150 sample rate, etc.). Such increased sampling frequency for the noise shaper may be advantageous in that the noise can be shifted to a higher frequency band (e.g. above the audible limit) and further attenuated by one or more filter elements 7, 940a-d at the input a transducer 5, 9 950a-b, 960.

Figure 9:
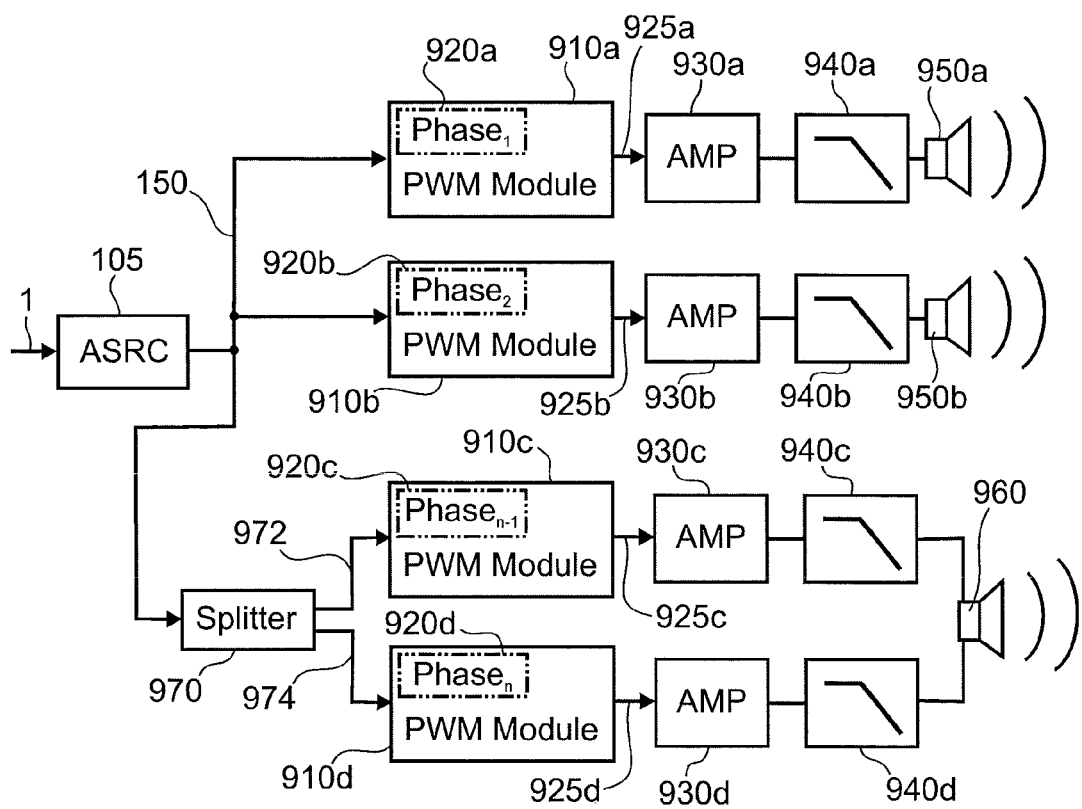
FIG. 9 shows a multichannel audio system in accordance with the present disclosure.

FIG. 9 shows aspects of a multichannel audio system in accordance with the present disclosure. The multichannel audio system includes a plurality of transducers 950a, 950b, 960, and associated signal conditioning elements (together forming one or more channels, bridge channels, etc.), including filters 940a-d, amplifiers 930a-d, and PWM modules 910a-d each in accordance with the present disclosure. The multichannel audio system may include a splitter 970 and an ASRC 105 in accordance with the present disclosure.

In aspects, the splitter 970 may be configured to accept a resampled signal 150 (or equivalent input signal) and to produce a positive signal 972 and a negative signal 974. The positive signal 972 and negative signal 974 are compliments of each other, each used to drive a portion of a bridge driver, as shown in FIG. 9.

The amplifiers 930a-d may be equivalent to the driver(s) 130 in accordance with the present disclosure. One or more of the amplifiers 930a-d may include a class D amplifier, optionally including one or more control schemes (e.g sigma-delta modulation, audio band noise shaping, pulse-width-modulation, bang-bang control schemes, modified PWM schemes, feedback control schemes, etc.). The amplifiers 930a-d may include a nonlinear compensation scheme and/or feedback control to further reduce THD, perhaps associated with specific nonlinearities in the amplifiers 930a-d themselves, or the transducers 950a,b, 960.

In one non-limiting example, sliding mode control (SMC) may be used to increase the PSRR and BW versus other methods. The SMC is based upon the notion of a sliding surface about which a hysteresis is provided to generate a corrective signal whenever the target moves more than the hysteresis distance from the sliding surface. Switch frequency for SMC may be dependent on the modulation index.

One or more amplifiers 930a-d may include a class K amplifier (e.g. a current controlled voltage amplifier). Alternatively, additionally, or in combination, one or more amplifiers 930a-d may include a feedback circuit for determining a current flow, voltage, etc. delivered to the transducer(s) 950a, b, 960 during use.

The filters 940a-d may be configured to remove switching noise from the associated signals before providing the signals to the transducers 950a,b, 960. Some non-limiting examples of functions that may be included in one or more of the filters 940a-d include a filter circuit, an LC filter, an amplifier, a de-multiplexer, a switch array, a FIFO communication circuit, a charge accumulator circuit, combinations thereof, and the like.

The multichannel audio system as shown in FIG. 9 includes a plurality of PWM modules 910a-d, each module configured to accept a resampled signal 150 (or equivalent), or a signal derived therefrom (e.g. a positive signal 972, a negative signal 974, etc.) and to produce a PWM signal 925a-d. Each PWM module 910a-d includes a phase adjustment parameter 920a-d (e.g. Phase$_1$, Phase$_2$, Phase$_{n-1}$, Phase$_n$, etc.). The phase adjustment parameters 920a-d may be configured during startup or anytime during operation, in order to adjust the PWM switching delays between adjacent PWM signals 925a-d. Such adjustment may be advantageous for optimizing the power supply rejection ratio (PSRR) or minimize the switching noise crosstalk between channels for the multichannel audio system. In one non-limiting example, one or more of the phase adjustment parameters 920a-d may be configured to set the initial value of the carrier generator within each PWM module 910a-d. Such an example may provide a simple approach for adjusting the phase between adjacent PWM signals 925a-d without the need for additional hardware.

In aspects, the signal processing system may include a plurality of bridge channels (similar in scope to the bridge channel including the splitter 970, the PWM modules 920c,d, the amplifiers 930c,d, the filters 940c,d and the transducer 960 shown in FIG. 9). The phase adjustment parameters 920a-d within and between each bridge channel may be adjusted such that temporally adjacent edges between PWM signals 925a-d are spaced apart in time so that each rising edge is followed by a falling edge and vice versa. In addition, any adjacent edge transitions (i.e. rising or falling) may be spaced sufficiently apart in time that they do not effectively occur at the same time. Such a configuration may be advantageous for significantly decreasing power supply ripple, IMD, THD and/or signal noise during operation.

Figure 10:
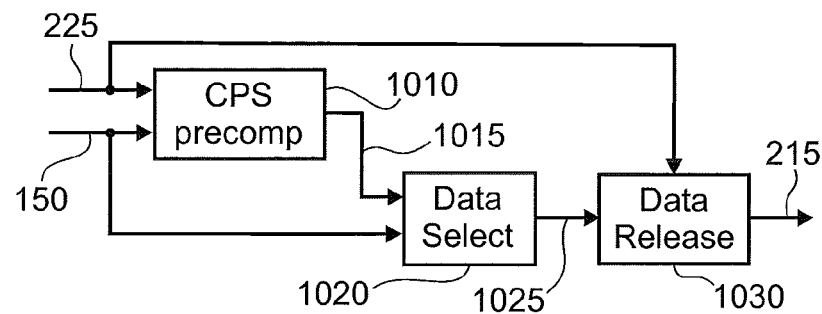
FIG. 10 shows a cross-point selection (CPS) block in accordance with the present disclosure.

FIG. 10 shows a cross-point selection (CPS) block in accordance with the present disclosure. The CPS block includes a CPS comparator 1010, a data selection block 1020, and an optional data release block 1030. The CPS comparator 1010 may be configured to compare the carrier signal 225 and the resampled signal 150 (or a signal generated therefrom, an equivalent signal provided by an external source, etc.) and to generate a selection signal 1015. The selection signal 1015 may be exerted, pulsed, and/or transitioned from a first state to a second state based upon the comparison of the inputs in the CPS comparator 1010 (e.g. when the input signals thereto are equal, within a predetermined range of each other, etc.). The data selection block 1020 may be configured to accept the selection signal 1015 and the resampled signal 150 (or a signal generated therefrom, an equivalent signal provided by an external source, etc.), and to generate a selected signal 1025 equivalent to the resampled signal 150 sample whenever the selection signal 1015 is exerted. The CPS block may include a data release block 1020 configured to accept the carrier signal 225 or a signal generated therefrom (e.g. a synchronization signal 825 in accordance with the present disclosure, a max/min signal, etc.), and the selected signal 1025 to produce a triggered signal 215, 235 in accordance with the present disclosure. Thus the triggered signal 215, 235 may be exerted at predetermined points corresponding to the carrier signal (e.g. once per cycle, twice per cycle, etc.). Such synchronous updates between triggered signal 215, 235 and the carrier signal 225 may be advantageous to minimize bit errors, decrease PWM sampling requirements, maintain adequate timing results, to facilitate simplified signal encoding based upon this approach, etc.

The carrier signal 225 and the resampled signal 150 (or a signal generated therefrom, an equivalent signal provided by an external source, etc.) may be of different resolution (i.e. different bit count). In this case, the comparison may be made down to the LSB of the signal with the lower bit count (e.g. the carrier signal 225). The carrier signal 225 and the resampled signal 150 (or a signal generated therefrom, an equivalent signal provided by an external source, etc.) may be sampled at the same rates or at arbitrary rates. In general it may be advantageous for the sample rates for either signal to be significantly higher than that of the overall carrier signal 225 frequency (i.e. the frequency associated with the waveform of the carrier signal 225).

Figure 11:
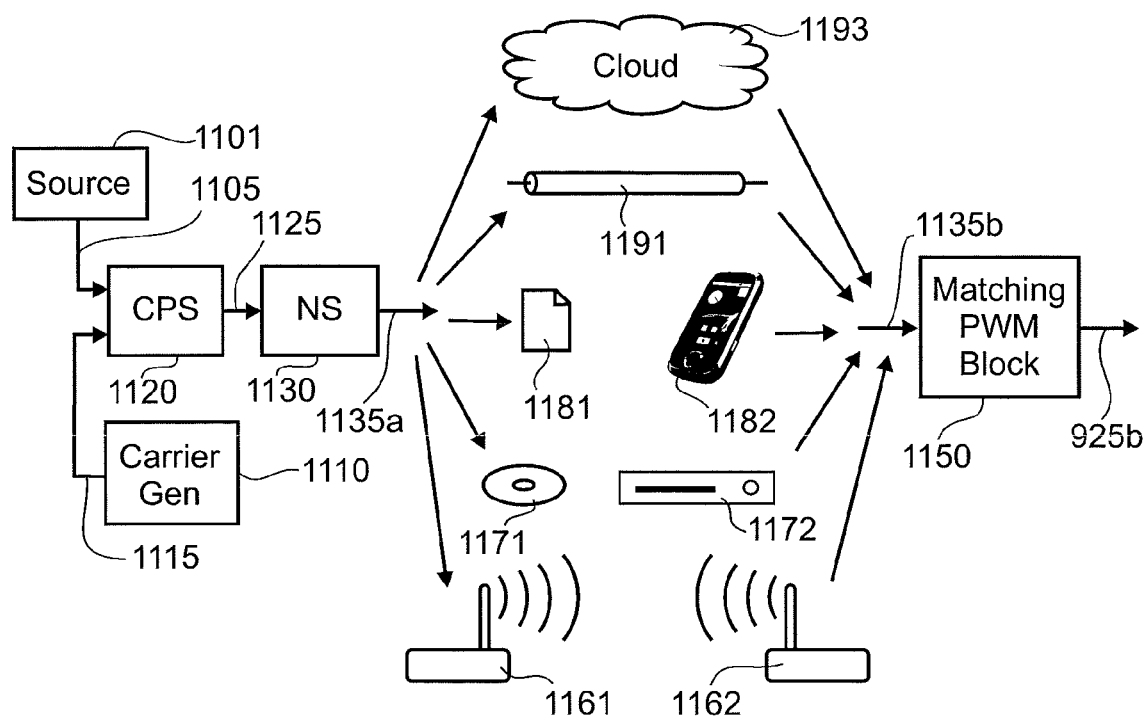
FIG. 11 shows an implementation of an encoding scheme for streaming and/or reproduction based on the signal conversion system in accordance with the present disclosure.

FIG. 11 shows an implementation of an encoding scheme for streaming and/or reproduction based on the signal conversion system in accordance with the present disclosure. The encoding scheme may be advantageous to provide computationally efficient, low noise, and low switching frequency PWM based playback, streaming, and/or reproduction of a signal encoded (e.g. an audio signal, video signal, telemetry signal) at a remote location. As shown in the FIG. 11, the signal conversion system may be physically split into two portions, a remote portion and a playback portion. The remote portion accepts an input signal 1105 from a source 1101 to a CPS block 1120 in accordance with the present disclosure. The remote portion also includes a carrier generator 1110 in accordance with the present disclosure. The carrier generator 1110 creates a carrier signal 1115 that is also fed to the CPS block 1120. The CPS block 1120 is configured to analyze the input signal 1105 and the carrier signal 1115 and to generate a triggered signal 1125 therefrom. The remote portion may also include a noise shaper 1130 in accordance with the present disclosure. The noise shaper 1130 may be configured to accept the triggered signal 1125 and to perform truncation and/or noise shaping thereupon to produce a truncated signal 1135a. The truncated signal 1135a may be updated at a rate corresponding to the frequency of the carrier signal 1115 (e.g. once per carrier cycle, twice per carrier cycle, etc.) and may be sufficiently noise shaped and truncated so as to be easily replayed without expensive hardware requirements.

The truncated signal 1135a may be wirelessly transmitted via one or more transmitters 1161, 1162 (e.g. WiFi®, Bluetooth®, etc.), stored to a physical medium 1171 (e.g. a CD, DVD, Blue Ray®, etc.) for playback on a corresponding playback device 1172, stored to a file 1181 (e.g. an audio file, etc.) for playback/streaming on a consumer electronics device 1182, delivered via a wired transmission 1191, and/or transmitted over an interne/cloud 1193 based network to a corresponding playback portion. The playback portion includes a matching PWM bock 1150 in accordance with the present disclosure. The PWM block 1150 may include a matching carrier generator configured to generate a carrier signal that corresponds to the same carrier signal used during production of the truncated signal 1135a. The matching PWM block 1150 may be configured to accept an incoming truncation signal 1135b (e.g. a truncation signal 1135a but perhaps provided in a physically different form), and generate the corresponding PWM signal 1155 for delivery to a transducer, filter network, circuit and/or driver in accordance with the present disclosure.

This configuration may be advantageous for providing playback and/or streaming of a high quality signal with reduced driver related switching losses and without expensive hardware in the playback portion (e.g. located on the playback device).

In one non-limiting example, the signal 1105 may be uniquely enhanced for playback on the corresponding user device (1182, 1172, playback portion, etc.). In this configuration, the signal processing related to the enhanced playback may be implemented prior to providing the signal 1105 to the CPS block 1120 in the remote portion. Such a configuration may be advantageous for simplifying and or improving a customer experience with an audio streaming process (e.g. a cloud based audio streaming service). In one non-limiting example, a user profile stored with an audio streaming service may include one or more audio processing parameters corresponding to the playback portion (e.g. corresponding to the device upon which playback is expected), suitable for optimizing audio output on the intended playback device. Thus an audio stream 1105 from an audio streaming service may be remotely processed in the remote portion before sending the resulting truncated signal 1135a to the matching PWM block 1150 on the consumer electronic device for playback.

Figure 12:
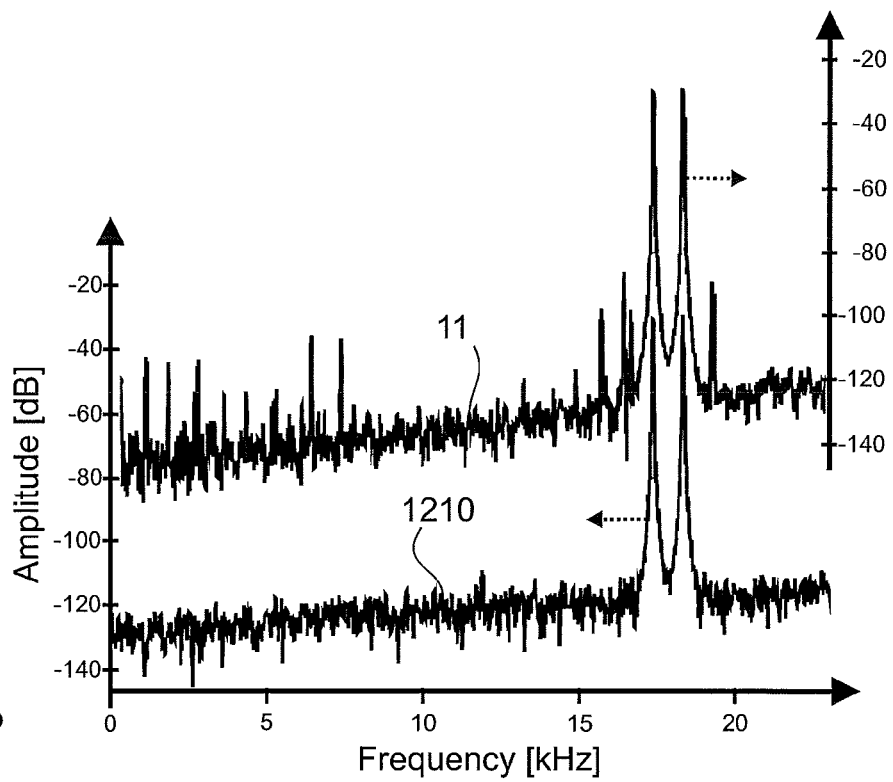
FIG. 12 shows IMD plots for PWM signals generated by a digital PWM and a preconditioned PWM method in accordance with the present disclosure.

FIG. 12 shows IMD plots for PWM signals generated by a digital PWM (e.g. basic PWM signal 11) and a signal conversion system 100 in accordance with the present disclosure (i.e. preconditioned PWM signal 1210 in accordance with the present disclosure). The signals are offset vertically for clarity. The test signals used in both cases include two tones centered at 18 kHz and 19 kHz respectively.

The basic PWM signal 11 clearly demonstrates increased intermodulation distortion as well as significant sub harmonic spurs. Such distortion is audibly significant for a user and may have a negative influence on user experience.

The preconditioned PWM signal 1210 in accordance with the present disclosure is shown in FIG. 12 as well. It is clear from the figure that the IMD is significantly improved compared with the uncompensated PWM approach (basic PWM signal 11). In this case, the spurs evident in the basic PWM signal 11 are not present in the preconditioned PWM signal 1210.

Figure 13:
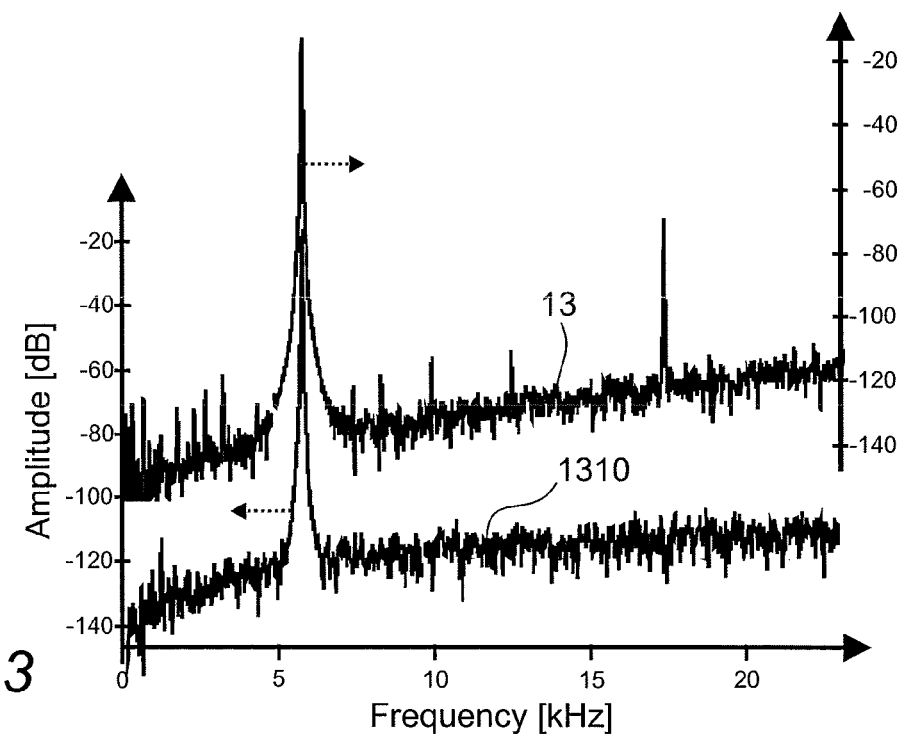
FIG. 13 shows THD plots for PWM signals generated by a digital PWM and a preconditioned PWM method in accordance with the present disclosure.

FIG. 13 shows THD plots for PWM signals generated by a digital PWM (i.e. a basic PWM signal 13) and a signal conversion system 100 in accordance with the present disclosure (i.e. preconditioned PWM signal 1310 in accordance with the present disclosure). The signals are offset vertically for clarity. The test signals used in both cases include a single tone centered at 6 kHz.

The basic PWM signal 13 clearly demonstrates increased total harmonic distortion as well as significant switching related artifacts. Such distortion is audibly significant for a user and may have a negative influence on user experience.

The preconditioned PWM signal 1310 in accordance with the present disclosure is shown in FIG. 13 as well. It is clear from the figure that the THD is significantly improved for the preconditioned PWM signal 1310 as opposed to the basic PWM signal 13 and is more representative of an ideal PWM signal.

EXAMPLE

In one non-limiting example, the cross enable unit includes a FIFO buffer suitable for storing 16 successive samples. The cross enable unit includes a counter that counts the number of clock cycles between each input sample, thus forming a count-disparity signal updated at the input sample rate. The counter sends the count-disparity signal to the FIFO buffer. The input sample corresponding to the associated count-disparity sample may be stored together within the FIFO buffer. This may be used to keep everything in sync as signals are passed through the cross enable unit signal train.

The averaging block includes an $8^{th}$ order moving average filter, to compute average count-disparity values from the successive count-disparity samples stored in the FIFO buffer. Thus the output of the averaging block is a stabilized count-disparity signal representative of the difference between the clock signal sample rate and the averaged input sample rate. The averaged count-disparity signal is then input to the first sigma-delta loop. The first sigma-delta loop accepts the count-disparity signal at the averaged de-jittered sample rate, in combination with the desired resampling rates to form a temporal correction value. In this, non-limiting example, the cross enable unit produces a first resampled clock signal with a sample rate of 16× of the averaged input sample rate, a second resampled clock signal with a sample rate of 512× the averaged input sample rate, and a de-jittered clock signal with a sample rate of 1× the averaged input sample rate. Thus, the sigma-delta loop temporal correction value is formed by dividing the averaged count-disparity values by 512 (in this case a bit shift of 9 bits).

The integer and remainder portions of the temporal correction value are separated within the first sigma-delta loop. The integer portion of the temporal correction value is sent to the resampled clock generator, which uses this value to insert the appropriate number of clock cycles between successive samples of the 512× resampled clock signal. The remainder portion of the temporal correction value is retained and successively added back into the temporal correction value, to retain a perfect conversion. The resampled clock generator provides feedback to the first sigma-delta loop once every sample of the 512× resampled clock signal in order to trigger iteration of the first sigma-delta loop.

The resampled clock generator constructs one or more resampled clock signals from the temporal correction values and the clock signal. In this, non-limiting example, the resampled clock generator forms a 512× resampled clock signal as well as a 16× and a 1× resampled clock signal. The 16× and 1× resampled clock signals are formed via decimation of the 512× resampled clock signal. The 1× resampled clock signal is the de-jittered clock signal and may be used as feedback within the sample rate converter in order to trigger events in each block at a substantially stabilized sample rate.

Continuing with the non-limiting example, the FIR filter module accepts the 1×, 16×, resampled clock signals along with the de-jittered signal. The FIR filter module includes a low pass polyphase FIR filter that up samples the de-jittered signal to the 16× resampled clock rate.

An L-branch polyphase FIR filter transfer function of order N may be calculated as follows:

$$Q(z) = \sum_{m=0}^{L-1} z^{-m} E_m(z^L) \qquad \text{Equation 1}$$

where $$E_m(z) = \sum_{n=0}^{\frac{N+1}{L}} h[Ln + m] z^{-m} \qquad \text{Equation 2}$$

and h[n]=0 for n>N and where h[n] are coefficients of the FIR filter. The particular coefficients may be determined during the design process, configured during operation by a real-time process (such as a real-time control algorithm), and/or configured by a set of preconfigured parameters, which may be uploaded to the sample rate converter by a firmware upgrade, as control parameters accompanying a data stream, etc.

Thus the FIR filter module generates a filtered intermediate signal at the 16× resampled rate. The linear interpolation unit accepts the filtered intermediate signal as well as the 16× and 512× resampled clock signals and the clock signal. The linear interpolation unit includes a second sigma delta loop into which the difference between successive filtered intermediate samples $s_{n+1}$ and $s_n$ is divided by the resample rate (in this case 32), to form a correction signal. The correction signal is interpreted as having an integer part and a remainder part. For each successive sample of the filtered intermediate signal, the output is computed as follows. Starting from $s_n$ the output is updated at each 512× resampled clock cycle. The integer part of the correction signal is added to the resampled output signal at each 512× resampled clock cycle and the remainder part of the correction signal is recycled back into the correction signal for use in successive samples. Thus the resampled signal is constructed in a very computationally efficient manner.

The resampled signal 150 is then available for the PWM module 120, 120a, 120b so as to provide a preconditioned signal for use in the CPS block 210, 230. The CPS block 210, 230 is configured to compare the resampled signal 150 to the carrier signal 225, 245 to produce a triggered signal 215, 235 for input to the PWM block 220, 240. The PWM block 220, 240 may then noise shape the triggered signal 215,235 to form the noise shaped signal 815, which is then compared with the carrier signal 225, 245 to produce the PWM signal(s) 125, 125a, 125b, 925a-d.

Generally speaking, in aspects, a non-periodic pulse width modulator including a sample rate converter and a PWM module each in accordance with the present disclosure may be configured to convert an asynchronous input signal at a first sample rate to one or more resampled output signals at variable (non-periodic) sample rates and to a pulsed representation thereof. The sample rate converter includes a cross enable unit, a linear interpolation unit and a FIR filter module each in accordance with the present disclosure. The cross enable unit includes a non-periodic signal generator, the output of which may be integrated into the re-sampling process (e.g. added into the count-disparity signal) to form a non-periodic resampled clock signal.

In aspects, a PWM module in accordance with the present disclosure may be paired with a sample rate converter for converting an asynchronous input signal at a first sample rate to a resampled output signal with a substantially maximized sample rate. The sample rate converter includes a frequency synthesizer configured to produce, and/or means of receiving a clock signal (e.g. a high frequency system clock), The sample rate converter may include a cross enable unit configured accept the clock signal and the input signal, and to generate an count disparity signal and a de-jittered signal sampled at substantially the mean of the first sample rate, and a linear interpolation unit configured to generate the resampled output signal at the sample rate of the clock signal. The linear interpolation unit may be configured to accept the de-jittered signal, the clock signal, and the count disparity signal. The linear interpolation unit may include a sigma-delta loop. The linear interpolation unit may be configured to calculate the difference between successive samples of the de-jittered signal on each clock cycle of the de-jittered signal and to input the difference into the sigma delta loop. The sigma delta loop may be configured to divide the difference by the count disparity signal to form a correction signal. The correction signal has an integer part and a remainder part. The sigma delta loop may be configured to add the integer part to the previous resampled signal on each cycle of the clock signal so as to generate the current sample of the resampled signal. The sigma delta loop may be configured to recycle the remainder part into the correction signal for use on subsequent cycles (e.g to maintain a perfect conversion). The PWM module may be configured to accept the resampled signal to generate a pulsed version thereof.

A method for generating a PWM signal in accordance with the present disclosure may include generating a carrier signal with a carrier signal frequency, accepting an input signal with a sample rate greater than the carrier signal frequency, comparing the carrier signal to the input signal (or a signal derived therefrom), and saving the input signal (or signal derived therefrom) at an instant when they are equal to each other to from a triggered signal, truncating the triggered signal with a noise shaper to form a truncated signal, and comparing the carrier signal with the truncated signal to generate the PWM signal.

The method may include resampling the input signal to a sample rate greater than the carrier signal frequency. Such resampling may be performed by an ASRC in accordance with the present disclosure. In aspects, the input signal may have sample rate less than the carrier signal frequency and it may be resampled to a sample rate greater than the carrier signal frequency.

A method for encoding an audio signal in accordance with the present disclosure may include generating a carrier signal with a carrier signal frequency, accepting an input signal with a sample rate greater than the carrier signal frequency, comparing the input signal (or a signal generated therefrom) to the carrier signal and saving the input signal (or signal derived therefrom) at an instant when they are equal to each other to form a triggered signal and truncating the triggered signal with a noise shaper to form an encoded signal (e.g. a truncated signal in accordance with the present disclosure).

A method for generating a PWM signal for streaming, playback, and/or reproduction of an encoded signal in accordance with the present disclosure including generating a matching carrier signal with the same frequency as the carrier signal frequency used to generate the encoded signal, and comparing the carrier signal with the encoded signal to generate the PWM signal.

A method for generating a PWM signal in accordance with the present disclosure includes calculating a count-disparity signal from the input signal and the clock signal, the count-disparity signal relating to the difference in sampling rate between the clock signal and the input signal; generating a temporal correction signal from the count-disparity signal, the temporal correction signal corresponding to at least a portion of the desired sample rates; calculating one or more re-sampled clock signals using the temporal correction signal; and interpolating the input signals and/or one or more intermediate signals at sample rates corresponding with one or more of the re-sampled clock signals to form at least a portion of the resampled signal; generating a carrier signal; and generating a the PWM signal from the resampled signal and the carrier signal.

The method may include a step of calculating one or more intermediate signals from the input signals and one or more of the re-sampled clock signals. The intermediate signals may be calculated by up-sampling and using a low pass filter, a FIR filter, a low pass polyphase FIR filter, etc.

Calculating a count-disparity signal may be accomplished by comparing the number of cycles of the clock signal between successive samples of the input signal in accordance with the present disclosure.

Generating a temporal correction signal may be accomplished by using a first sigma delta loop in accordance with the present disclosure.

Calculating one or more re-sampled clock signals using the temporal correction signal may be accomplished by using a clock generator in accordance with the present disclosure.

Interpolating the input signals and/or one or more intermediate signals may be at least partially accomplished by using a second sigma delta loop in accordance with the present disclosure.

The method may include filtering the count-disparity signal before calculating the temporal correction signal. The filtering may be accomplished by a low pass filter, a moving average filter, a low pass polyphase FIR filter, etc.

The method may include adding a non-periodic signal to the count-disparity signal. Such a non-periodic signal may be provided by a random number generator, a thermal number generator, etc. Such a non-periodic addition may be advantageous to form one or more spread spectrum resampled output signals.

A signal conversion system including both the ASRC and the PWM module in accordance with the present disclosure may accept adaptive, optionally non-periodic clock signals for generating the resampled signals, carrier signal and/or PWM signals. The signal conversion system may be configured to produce an adaptive PWM signal, by varying the sample rate thereof in order to achieve the bandwidth requirements for the system while minimizing power consumption. Such a configuration may be advantageous for use in a consumer electronics device in accordance with the present disclosure.

The signal conversion system may be configured to process multiple PWM-channels, potentially each channel having a variable individually adjustable delay and/or independently generated sampling rates in order to avoid cross talk and minimize electrically mitigated interference emitted therefrom. The ASRC and PWM module combination in accordance with the present disclosure may be advantageous for more easily implementing multi-transducer systems without significantly increasing intermodulation distortion and/or power supply ripple.

It will be appreciated that additional advantages and modifications will readily occur to those skilled in the art. Therefore, the disclosures presented herein and broader aspects thereof are not limited to the specific details and representative embodiments shown and described herein. Accordingly, many modifications, equivalents, and improvements may be included without departing from the spirit or scope of the general inventive concept as defined by the appended claims and their equivalents.

What is claimed is:

1. A signal conversion system for converting an input signal to a pulse width modulated (PWM) output signal comprising:
a clock source for generating and/or for accepting a clock signal;
a carrier generator configured to generate a carrier signal with a carrier signal frequency;
a cross-point section (CPS) block comprising a CPS comparator to compare the carrier signal to the input signal or a signal derived therefrom to produce a triggered signal based on the comparison and the input signal or the signal derived therefrom;
a noise shaper configured to bit depth reduce the triggered signal to form a truncated signal;
a PWM comparator configured to compare the truncated signal and/or a signal generated therefrom with the carrier signal to produce the PWM output signal; and
a sample rate converter comprising a counter configured to generate a count-disparity signal from the clock signal and the input signal, a first sigma delta unit configure to calculate a temporal correction value from the count disparity signal, a resampled clock generator configured to generate one or more resampled clock signals from the temporal correction value, and a second sigma delta unit configured to generate the resampled signal from one or more of the resampled clock signals and the input signal.

2. The signal conversion system in accordance with claim 1, wherein the sample rate converter is configured to resample the input signal to a resampled signal with a sample rate greater than the carrier signal frequency, wherein the CPS comparator is configured to accept the resampled signal.

3. The signal conversion system in accordance with claim 1, wherein the noise shaper is configured to shift the noise on the triggered signal, the input signal, and/or the resampled signal to a substantially inaudible frequency band to form the truncated signal.

4. The signal conversion system in accordance with claim 1, wherein the noise shaper includes an $n^{th}$ order delta-sigma modulator configured to perform the bit depth reduction and/or noise shifting, and wherein n is a positive integer.

5. The signal conversion system in accordance with claim 1, wherein the noise shaper includes a threshold of hearing model.

6. The signal conversion system in accordance with claim 1, wherein the carrier generator is configured to accept a phase correction parameter, and wherein the carrier signal is dependent upon the phase correction parameter.

7. The signal conversion system in accordance with claim 6, wherein the phase correction parameter is configured to set an initial value for the carrier signal.

8. The signal conversion system in accordance with claim 1, further comprising an analyzer configured to accept the input signal, the resampled signal or a signal generated therefrom and/or an external input and to calculate a PWM control signal, wherein the carrier generator, the PWM comparator, and/or the noise shaper is configured to accept the PWM control signal.

9. The signal conversion system in accordance with claim 8, wherein the analyzer is configured to calculate a power level from at least a portion of the resampled signal or a signal generated therefrom, and wherein the PWM control signal is dependent upon the power level.

10. The signal conversion system in accordance with claim 8, wherein the analyzer is configured to accept an external input at least partially representative of a property selected from the group consisting of temperature, humidity, sound level, loudspeaker feedback, voltage level, transducer current level, speaker enclosure temperature, speaker enclosure pressure level, and/or a combination thereof.

11. The signal conversion system in accordance with claim 1, further comprising a FIFO buffer coupled to the counter and the input signal and configured to store successive samples of the input signal and the count-disparity signal.

12. The signal conversion system in accordance with claim 11, further comprising an averaging block, coupled to the counter or the FIFO buffer and the first sigma delta loop, and configured to calculate an averaged count-disparity signal from the count disparity signal, wherein the first sigma delta loop is configured to accept the averaged count-disparity signal.

13. The signal conversion system in accordance with claim 1, wherein the resampled clock generator is configured to resample the input signal to form a de-jittered signal having a substantially stabilized sample rate.

14. The signal conversion system in accordance with claim 13, further comprising a low pass filter coupled to the resampled clock generator and the second sigma delta loop, wherein the low pass filter is configured to accept one or more resampled clock signals and the input signal or the de-jittered signal, and to calculate a filtered intermediate signal, and wherein the second sigma delta loop is configured to accept the filtered intermediate signal.

15. A signal conversion system for converting an input signal to a pulse width modulated (PWM) signal comprising:
- a clock source for generating and/or for accepting a clock signal;
- a cross enable unit configured to generate one or more resampled clock signals and a de-jittered signal from the input signal and the clock signal;
- a linear interpolation unit configured to generate a resampled signal from the de-jittered signal, the clock signal, and one or more of the resampled clock signals; and
- a pulse width modulation (PWM) module comprising a carrier generator to generate a carrier signal, and a PWM comparator configured to compare the resampled signal or a signal derived therefrom and the carrier signal to form the PWM signal.

16. The signal conversion system in accordance with claim 15, further comprising a FIR filter module including a low pass filter, the FIR filter module configured to generate a filtered intermediate signal from the de-jittered signal, the clock signal, and one or more of the resampled clock signals, wherein the linear interpolation unit is configured to accept the filtered intermediate signal.

17. The signal conversion system in accordance with claim 15, wherein the cross enable unit comprises:
- a counter configured to generate a count-disparity signal from the clock signal and the input signal;
- a first sigma delta unit configured to calculate a temporal correction value from the count-disparity signal; and
- a resampled clock generator configured to generate the one or more resampled clock signals from the temporal correction value.

18. The signal conversion system in accordance with claim 17, wherein the cross enable unit comprises a FIFO buffer configured to store at least a sample of the count-disparity signal and input signal, and to release the sample to the first sigma delta loop.

19. A method for generating a pulse width modulated (PWM) signal from an input signal and a clock signal both with respective sample rates comprising:
- calculating a count disparity signal from the input signal and the clock signal, the count disparity signal relating to the difference in sampling rate between the clock signal and the input signal;
- generating a temporal correction signal from the count-disparity signal, the temporal correction signal corresponding to a new sample rate, different from the input signal sample rate or the clock signal sample rate;
- interpolating the input signal at the new sample rate to form a resampled signal;
- forming a carrier signal with an initial value; and
- comparing the resampled signal or a signal generated therefrom with the carrier signal to form the PWM signal.

20. The method in accordance with claim 19, further comprising:
- comparing the input signal, the resampled signal, or a signal generated therefrom with the carrier signal to form a triggered signal;
- truncating the triggered signal to form a truncated signal; and
- using the truncated signal in the comparison.

21. The method in accordance with claim 19, wherein the step of generating a temporal correction signal is at least partially accomplished by using a first sigma delta loop.

22. The method in accordance with claim 19, wherein the step of interpolating the input signal is at least partially accomplished by using a second sigma delta loop.

23. The method in accordance with claim 19, further comprising adding a non-periodic signal to the count-disparity signal.

24. The method in accordance with claim 19, further comprising shifting the noise of the resampled signal or a signal derived therefrom into a substantially inaudible frequency band.

* * * * *